US008749053B2

(12) United States Patent
Adibi et al.

(10) Patent No.: US 8,749,053 B2
(45) Date of Patent: Jun. 10, 2014

(54) PLASMA GRID IMPLANT SYSTEM FOR USE IN SOLAR CELL FABRICATIONS

(75) Inventors: Babak Adibi, Los Altos, CA (US); Moon Chun, San Jose, CA (US)

(73) Assignee: Intevac, Inc., Santa Clara, CA (US)

( * ) Notice: Subject to any disclaimer, the term of this patent is extended or adjusted under 35 U.S.C. 154(b) by 156 days.

(21) Appl. No.: 12/821,053

(22) Filed: Jun. 22, 2010

(65) Prior Publication Data

US 2010/0323508 A1   Dec. 23, 2010

Related U.S. Application Data

(60) Provisional application No. 61/219,379, filed on Jun. 23, 2009.

(51) Int. Cl.
    *H01L 21/265* (2006.01)
(52) U.S. Cl.
    USPC .................... 257/715; 438/513; 257/E21.334
(58) Field of Classification Search
    USPC .................... 438/513; 156/345; 257/E21.334
    See application file for complete search history.

(56) References Cited

U.S. PATENT DOCUMENTS

| | | | |
|---|---|---|---|
| 3,607,450 A | 9/1971 | Kiewit | |
| 3,786,359 A | 1/1974 | King | |
| 3,790,412 A | 2/1974 | Moline | |
| 3,948,682 A | 4/1976 | Bordina et al. | 136/89 |
| 3,969,163 A | 7/1976 | Wakefield | 148/174 |
| 3,969,746 A | 7/1976 | Kendall et al. | 357/30 |
| 3,976,508 A | 8/1976 | Mlavsky | 136/89 |
| 4,001,864 A | 1/1977 | Gibbons | 357/30 |
| 4,004,949 A | 1/1977 | Lesk | 148/1.5 |
| 4,021,276 A | 5/1977 | Cho et al. | |
| 4,029,518 A | 6/1977 | Matsutani et al. | 136/89 |
| 4,056,404 A | 11/1977 | Garone et al. | 136/89 |

(Continued)

FOREIGN PATENT DOCUMENTS

| | | |
|---|---|---|
| CN | 1198597 A | 11/1998 |
| CN | 1638015 A | 7/2005 |

(Continued)

OTHER PUBLICATIONS

Copenheaver, Blaine R., Authorized Officer, International Searching Authority, International Search Report and Written Opinion, Application No. PCT/US2010/039690, mailed Oct. 7, 2010. 12 pgs.

(Continued)

*Primary Examiner* — William F Kraig
*Assistant Examiner* — Edward Chin
(74) *Attorney, Agent, or Firm* — Nixon Peabody LLP; Joseph Bach, Esq.

(57) ABSTRACT

A method of ion implantation comprising: providing a plasma within a plasma region of a chamber; positively biasing a first grid plate, wherein the first grid plate comprises a plurality of apertures; negatively biasing a second grid plate, wherein the second grid plate comprises a plurality of apertures; flowing ions from the plasma in the plasma region through the apertures in the positively-biased first grid plate; flowing at least a portion of the ions that flowed through the apertures in the positively-biased first grid plate through the apertures in the negatively-biased second grid plate; and implanting a substrate with at least a portion of the ions that flowed through the apertures in the negatively-biased second grid plate.

18 Claims, 10 Drawing Sheets

(56) References Cited

U.S. PATENT DOCUMENTS

| | | | | |
|---|---|---|---|---|
| 4,070,205 A | 1/1978 | Rahilly | | 136/89 |
| 4,070,689 A | 1/1978 | Coleman et al. | | 357/30 |
| 4,072,541 A | 2/1978 | Meulenberg, Jr. et al. | | 136/89 |
| 4,086,102 A | 4/1978 | King | | 136/89 |
| 4,090,213 A | 5/1978 | Maserjian et al. | | 357/30 |
| 4,095,329 A | 6/1978 | Ravi | | 29/572 |
| 4,116,717 A | 9/1978 | Rahilly | | 136/89 |
| RE29,833 E | 11/1978 | Mlavsky | | 136/89 |
| 4,131,486 A | 12/1978 | Brandhorst, Jr. | | 136/89 |
| 4,131,488 A | 12/1978 | Lesk et al. | | 148/1.5 |
| 4,141,756 A | 2/1979 | Chiang et al. | | 148/1.5 |
| 4,144,094 A | 3/1979 | Coleman et al. | | 136/89 |
| 4,152,536 A | 5/1979 | Ravi | | 136/89 |
| 4,152,824 A | 5/1979 | Gonsiorawski | | 29/572 |
| 4,179,311 A | 12/1979 | Athanas | | 148/1.5 |
| 4,219,830 A | 8/1980 | Gibbons | | 357/30 |
| 4,227,941 A | 10/1980 | Bozler et al. | | 136/255 |
| 4,253,881 A | 3/1981 | Hezel | | 136/256 |
| 4,273,950 A | 6/1981 | Chitre | | 136/255 |
| 4,295,002 A | 10/1981 | Chappell et al. | | 136/244 |
| 4,301,592 A | 11/1981 | Lin | | 29/590 |
| 4,322,571 A | 3/1982 | Stanbery | | 136/255 |
| 4,353,160 A | 10/1982 | Armini et al. | | 29/572 |
| RE31,151 E | 2/1983 | King | | 136/89 |
| 4,377,722 A | 3/1983 | Wested | | 136/244 |
| 4,379,944 A | 4/1983 | Borden et al. | | 136/259 |
| 4,404,422 A | 9/1983 | Green et al. | | 136/255 |
| 4,421,577 A | 12/1983 | Spicer | | 148/187 |
| 4,428,783 A | 1/1984 | Gessert | | 148/172 |
| 4,448,865 A | 5/1984 | Bohlen et al. | | |
| 4,449,286 A | 5/1984 | Dahlberg | | 29/572 |
| 4,456,489 A | 6/1984 | Wu | | 148/1.5 |
| 4,479,027 A | 10/1984 | Todorof | | 136/249 |
| 4,490,573 A | 12/1984 | Gibbons | | 136/255 |
| 4,495,375 A | 1/1985 | Rickus et al. | | 136/255 |
| 4,522,657 A | 6/1985 | Rohatgi et al. | | |
| 4,524,237 A | 6/1985 | Ross et al. | | 136/261 |
| 4,533,831 A | 8/1985 | Itoh et al. | | |
| 4,539,431 A | 9/1985 | Moddel et al. | | 136/258 |
| 4,540,843 A | 9/1985 | Gochermann et al. | | 136/251 |
| 4,542,256 A | 9/1985 | Wiedeman | | 136/249 |
| 4,581,620 A | 4/1986 | Yamazaki et al. | | 357/2 |
| 4,587,430 A | 5/1986 | Adler | | |
| 4,589,191 A | 5/1986 | Green et al. | | 29/572 |
| 4,633,138 A | 12/1986 | Tokiguchi et al. | | |
| 4,665,277 A | 5/1987 | Sah et al. | | 136/255 |
| 4,667,060 A | 5/1987 | Spitzer | | 136/255 |
| 4,676,845 A | 6/1987 | Spitzer | | 148/33.3 |
| 4,681,983 A | 7/1987 | Markvart et al. | | 136/255 |
| 4,719,355 A | 1/1988 | Meyers et al. | | |
| 4,758,525 A | 7/1988 | Kida et al. | | 437/2 |
| 4,828,628 A | 5/1989 | Hezel et al. | | 136/255 |
| 4,830,678 A | 5/1989 | Todorof et al. | | 136/259 |
| 4,834,805 A | 5/1989 | Erbert | | 136/246 |
| 4,886,555 A | 12/1989 | Hackstein et al. | | 136/255 |
| 4,900,369 A | 2/1990 | Hezel et al. | | 136/255 |
| 5,009,720 A | 4/1991 | Hokuyo et al. | | 136/255 |
| 5,112,409 A | 5/1992 | Warfield et al. | | 136/256 |
| 5,125,983 A | 6/1992 | Cummings | | 136/246 |
| 5,132,544 A | 7/1992 | Glavish | | |
| 5,290,367 A | 3/1994 | Hayashi et al. | | 136/255 |
| 5,306,647 A | 4/1994 | Lehmann et al. | | 437/2 |
| 5,330,584 A | 7/1994 | Saga et al. | | 136/255 |
| 5,356,488 A | 10/1994 | Hezel | | 136/246 |
| 5,374,456 A | 12/1994 | Matossian et al. | | 427/570 |
| 5,421,889 A | 6/1995 | Pollack et al. | | |
| 5,516,725 A | 5/1996 | Chang et al. | | |
| 5,554,854 A | 9/1996 | Blake | | |
| 5,583,368 A | 12/1996 | Kenney | | |
| H1637 H | 3/1997 | Offord et al. | | |
| 5,641,362 A | 6/1997 | Meier | | 136/256 |
| 5,693,376 A | 12/1997 | Fetherston et al. | | 427/523 |
| 5,760,405 A | 6/1998 | King et al. | | |
| 5,831,321 A | 11/1998 | Nagayama | | |
| 5,883,391 A | 3/1999 | Adibi et al. | | |
| 5,885,896 A | 3/1999 | Thakur et al. | | |
| 5,907,158 A | 5/1999 | Nasser-Ghodsi et al. | | |
| 5,932,882 A | 8/1999 | England et al. | | |
| 5,935,345 A | 8/1999 | Kuznicki | | 136/255 |
| 5,945,012 A | 8/1999 | Chan | | |
| 5,963,801 A | 10/1999 | Aronowitz et al. | | |
| 5,985,742 A | 11/1999 | Henley et al. | | |
| 5,988,103 A | 11/1999 | Fetherston et al. | | 118/723 E |
| 5,994,207 A | 11/1999 | Henley et al. | | |
| 5,998,282 A | 12/1999 | Lukaszek | | |
| 6,006,253 A | 12/1999 | Kumar et al. | | |
| 6,010,579 A | 1/2000 | Henley et al. | | |
| 6,013,563 A | 1/2000 | Henley et al. | | |
| 6,016,036 A | 1/2000 | Brailove | | |
| 6,033,974 A | 3/2000 | Henley et al. | | |
| 6,034,321 A | 3/2000 | Jenkins | | 136/252 |
| 6,048,411 A | 4/2000 | Henley et al. | | |
| 6,051,073 A | 4/2000 | Chu et al. | | |
| 6,060,718 A | 5/2000 | Brailove et al. | | |
| 6,083,324 A | 7/2000 | Henley et al. | | |
| 6,084,175 A | 7/2000 | Perry et al. | | 136/256 |
| 6,091,021 A | 7/2000 | Ruby et al. | | 136/261 |
| 6,093,625 A | 7/2000 | Wagner et al. | | |
| 6,103,599 A | 8/2000 | Henley et al. | | |
| 6,113,735 A | 9/2000 | Chu et al. | | |
| 6,120,660 A | 9/2000 | Chu et al. | | |
| 6,130,380 A | 10/2000 | Nakamura | | 136/255 |
| 6,138,606 A | 10/2000 | Ling | | |
| 6,146,979 A | 11/2000 | Henley et al. | | |
| 6,150,708 A | 11/2000 | Gardner et al. | | |
| 6,153,524 A | 11/2000 | Henley et al. | | |
| 6,155,909 A | 12/2000 | Henley et al. | | |
| 6,159,824 A | 12/2000 | Henley et al. | | |
| 6,159,825 A | 12/2000 | Henley et al. | | |
| 6,162,705 A | 12/2000 | Henley et al. | | |
| 6,171,965 B1 | 1/2001 | Kang et al. | | |
| 6,180,496 B1 | 1/2001 | Farrens et al. | | |
| 6,184,111 B1 | 2/2001 | Henley et al. | | |
| 6,186,091 B1 | 2/2001 | Chu et al. | | |
| 6,200,883 B1 | 3/2001 | Taylor et al. | | |
| 6,204,151 B1 | 3/2001 | Malik et al. | | |
| 6,207,005 B1 | 3/2001 | Henley et al. | | |
| 6,213,050 B1 | 4/2001 | Liu et al. | | |
| 6,217,724 B1 | 4/2001 | Chu et al. | | |
| 6,221,740 B1 | 4/2001 | Bryan et al. | | |
| 6,221,774 B1 | 4/2001 | Malik | | |
| 6,228,176 B1 | 5/2001 | Chu et al. | | |
| 6,245,161 B1 | 6/2001 | Henley et al. | | |
| 6,248,649 B1 | 6/2001 | Henley et al. | | |
| 6,263,941 B1 | 7/2001 | Bryan et al. | | |
| 6,265,328 B1 | 7/2001 | Henley et al. | | |
| 6,269,765 B1 | 8/2001 | Chu et al. | | |
| 6,271,566 B1 | 8/2001 | Tsuchiaki | | 257/347 |
| 6,274,459 B1 | 8/2001 | Chan | | |
| 6,281,428 B1 | 8/2001 | Chiu et al. | | 136/255 |
| 6,287,941 B1 | 9/2001 | Kang et al. | | |
| 6,290,804 B1 | 9/2001 | Henley et al. | | |
| 6,291,313 B1 | 9/2001 | Henley et al. | | |
| 6,291,314 B1 | 9/2001 | Henley et al. | | |
| 6,291,326 B1 | 9/2001 | Henley et al. | | |
| 6,294,434 B1 | 9/2001 | Tseng | | |
| 6,300,227 B1 | 10/2001 | Liu et al. | | |
| 6,321,134 B1 | 11/2001 | Henley et al. | | |
| 6,335,534 B1 | 1/2002 | Suguro et al. | | |
| 6,338,313 B1 | 1/2002 | Chan | | |
| 6,365,492 B1 | 4/2002 | Suguro et al. | | 438/514 |
| 6,383,876 B1 | 5/2002 | Son et al. | | 438/289 |
| 6,391,740 B1 | 5/2002 | Cheung et al. | | |
| 6,417,515 B1 | 7/2002 | Barrett et al. | | |
| 6,429,037 B1 | 8/2002 | Wenham et al. | | |
| 6,448,152 B1 | 9/2002 | Henley et al. | | |
| 6,458,723 B1 | 10/2002 | Henley et al. | | |
| 6,468,884 B2 | 10/2002 | Miyake et al. | | 438/481 |
| 6,476,313 B2 | 11/2002 | Kawano | | 136/255 |
| 6,486,478 B1 | 11/2002 | Libby et al. | | |
| 6,489,241 B1 | 12/2002 | Thilderkvist et al. | | |
| 6,495,010 B2 | 12/2002 | Sferlazzo | | |
| 6,500,732 B1 | 12/2002 | Henley et al. | | |
| 6,507,689 B2 | 1/2003 | Tirloni et al. | | 385/127 |

(56) References Cited

U.S. PATENT DOCUMENTS

| | | | |
|---|---|---|---|
| 6,534,381 B2 | 3/2003 | Cheung et al. | |
| 6,544,862 B1 | 4/2003 | Bryan | |
| 6,552,259 B1 | 4/2003 | Hosomi et al. | 136/255 |
| 6,552,414 B1 | 4/2003 | Horzel et al. | 257/655 |
| 6,594,579 B1 | 7/2003 | Lowrey et al. | |
| 6,604,033 B1 | 8/2003 | Banet et al. | |
| 6,611,740 B2 | 8/2003 | Lowrey et al. | |
| 6,613,974 B2 | 9/2003 | Husher | 136/255 |
| 6,632,324 B2 | 10/2003 | Chan | |
| 6,636,790 B1 | 10/2003 | Lightner et al. | |
| 6,660,928 B1 | 12/2003 | Patton et al. | 136/249 |
| 6,732,031 B1 | 5/2004 | Lightner et al. | |
| 6,780,759 B2 | 8/2004 | Farrens et al. | |
| 6,787,693 B2 | 9/2004 | Lizotte | 136/261 |
| 6,874,515 B2 | 4/2005 | Ishihara et al. | |
| 6,878,898 B2* | 4/2005 | Hogan et al. | 219/121.43 |
| 6,949,895 B2 | 9/2005 | DiVergilio et al. | |
| 7,011,733 B2* | 3/2006 | Sandhu | 204/192.15 |
| 7,022,984 B1 | 4/2006 | Rathmell et al. | |
| 7,078,317 B2 | 7/2006 | Henley | |
| 7,081,186 B2 | 7/2006 | Ehiasarian et al. | |
| 7,094,666 B2 | 8/2006 | Henley et al. | |
| 7,098,394 B2 | 8/2006 | Armer et al. | 136/244 |
| 7,147,709 B1 | 12/2006 | Ong et al. | |
| 7,166,520 B1 | 1/2007 | Henley | |
| 7,174,243 B1 | 2/2007 | Lightner et al. | |
| 7,225,047 B2 | 5/2007 | Al-Bayati et al. | |
| 7,225,065 B1 | 5/2007 | Hunt et al. | |
| 7,228,211 B1 | 6/2007 | Lowrey et al. | |
| 7,250,323 B2 | 7/2007 | Gadeken et al. | |
| 7,339,110 B1 | 3/2008 | Mulligan et al. | 136/256 |
| 7,354,815 B2 | 4/2008 | Henley | |
| 7,390,724 B2 | 6/2008 | Henley et al. | |
| 7,399,680 B2 | 7/2008 | Henley | |
| 7,427,554 B2 | 9/2008 | Henley et al. | |
| 7,447,574 B1 | 11/2008 | Washicko et al. | |
| 7,477,968 B1 | 1/2009 | Lowrey et al. | |
| 7,479,441 B2 | 1/2009 | Kirk et al. | |
| 7,480,551 B1 | 1/2009 | Lowrey et al. | |
| 7,498,245 B2 | 3/2009 | Aspar et al. | |
| 7,521,699 B2 | 4/2009 | Yamazaki et al. | |
| 7,523,159 B1 | 4/2009 | Williams et al. | |
| 7,532,962 B1 | 5/2009 | Lowrey et al. | |
| 7,532,963 B1 | 5/2009 | Lowrey et al. | |
| 7,547,609 B2 | 6/2009 | Henley | |
| 7,564,042 B2* | 7/2009 | Lee et al. | 250/396 R |
| 7,598,153 B2 | 10/2009 | Henley et al. | |
| 7,674,687 B2 | 3/2010 | Henley | |
| 7,727,866 B2 | 6/2010 | Bateman et al. | |
| 7,759,220 B2 | 7/2010 | Henley | |
| 7,767,561 B2 | 8/2010 | Hanawa et al. | |
| 7,772,088 B2 | 8/2010 | Henley et al. | |
| 7,776,727 B2 | 8/2010 | Borden | |
| 7,796,849 B2 | 9/2010 | Adibi et al. | |
| 7,867,409 B2* | 1/2011 | Brcka | 216/59 |
| 2001/0002584 A1 | 6/2001 | Liu et al. | |
| 2001/0017109 A1 | 8/2001 | Liu et al. | |
| 2001/0020485 A1 | 9/2001 | Ford et al. | |
| 2002/0090758 A1 | 7/2002 | Henley et al. | |
| 2002/0109233 A1 | 8/2002 | Farrar | |
| 2002/0109824 A1 | 8/2002 | Yamaguchi | |
| 2002/0139666 A1 | 10/2002 | Hsueh et al. | |
| 2002/0144725 A1 | 10/2002 | Jordan et al. | |
| 2002/0185700 A1 | 12/2002 | Coffa et al. | |
| 2003/0015700 A1 | 1/2003 | Eisenbeiser et al. | |
| 2003/0106643 A1* | 6/2003 | Tabuchi et al. | 156/345.35 |
| 2003/0116090 A1* | 6/2003 | Chu et al. | 118/723 E |
| 2003/0137050 A1 | 7/2003 | Chambers et al. | |
| 2003/0230986 A1* | 12/2003 | Horsky et al. | 315/111.81 |
| 2004/0025932 A1 | 2/2004 | Husher | |
| 2004/0067644 A1 | 4/2004 | Malik et al. | |
| 2004/0112426 A1 | 6/2004 | Hagino | |
| 2004/0187916 A1 | 9/2004 | Hezel | |
| 2004/0198028 A1 | 10/2004 | Tanaka et al. | |
| 2004/0216993 A1* | 11/2004 | Sandhu | 204/192.12 |
| 2005/0045835 A1 | 3/2005 | DiVergilio et al. | |
| 2005/0150597 A1 | 7/2005 | Henley et al. | |
| 2005/0181584 A1 | 8/2005 | Foad et al. | 438/514 |
| 2005/0247668 A1 | 11/2005 | Malik et al. | |
| 2006/0019039 A1 | 1/2006 | Hanawa et al. | |
| 2006/0037700 A1* | 2/2006 | Shi et al. | 156/345.43 |
| 2006/0148241 A1 | 7/2006 | Brody et al. | |
| 2006/0157733 A1* | 7/2006 | Lucovsky et al. | 257/192 |
| 2006/0166394 A1 | 7/2006 | Kukulka et al. | |
| 2006/0211219 A1 | 9/2006 | Henley et al. | |
| 2006/0234484 A1 | 10/2006 | Lanzerotti et al. | |
| 2006/0279970 A1 | 12/2006 | Kernahan | |
| 2007/0012503 A1 | 1/2007 | Iida | |
| 2007/0029043 A1 | 2/2007 | Henley | |
| 2007/0032044 A1 | 2/2007 | Henley | |
| 2007/0035847 A1 | 2/2007 | Li et al. | |
| 2007/0068624 A1* | 3/2007 | Jeon et al. | 156/345.4 |
| 2007/0081138 A1 | 4/2007 | Kerkhof et al. | 355/71 |
| 2007/0084505 A1 | 4/2007 | Zaidi | |
| 2007/0087574 A1 | 4/2007 | Gupta et al. | |
| 2007/0119373 A1* | 5/2007 | Kumar et al. | 118/723 I |
| 2007/0134840 A1 | 6/2007 | Gadeken et al. | |
| 2007/0148336 A1 | 6/2007 | Bachrach et al. | |
| 2007/0169806 A1 | 7/2007 | Fork et al. | 136/256 |
| 2007/0209707 A1 | 9/2007 | Weltman | |
| 2007/0217020 A1 | 9/2007 | Li et al. | 359/652 |
| 2007/0235074 A1 | 10/2007 | Henley et al. | |
| 2007/0277875 A1 | 12/2007 | Gadkaree et al. | |
| 2007/0281172 A1 | 12/2007 | Couillard et al. | |
| 2008/0001139 A1 | 1/2008 | Augusto | |
| 2008/0038908 A1 | 2/2008 | Henley | |
| 2008/0044964 A1 | 2/2008 | Kamath et al. | 438/164 |
| 2008/0078444 A1 | 4/2008 | Atanackovic | |
| 2008/0092944 A1 | 4/2008 | Rubin | |
| 2008/0092947 A1 | 4/2008 | Lopatin et al. | |
| 2008/0121275 A1 | 5/2008 | Ito et al. | |
| 2008/0121276 A1 | 5/2008 | Lopatin et al. | 136/256 |
| 2008/0128019 A1 | 6/2008 | Lopatin et al. | |
| 2008/0128641 A1 | 6/2008 | Henley et al. | 250/492.21 |
| 2008/0164819 A1 | 7/2008 | Hwang et al. | |
| 2008/0179547 A1 | 7/2008 | Henley | |
| 2008/0188011 A1 | 8/2008 | Henley | |
| 2008/0190886 A1 | 8/2008 | Choi et al. | |
| 2008/0206962 A1 | 8/2008 | Henley et al. | |
| 2008/0242065 A1* | 10/2008 | Brcka | 438/513 |
| 2008/0296261 A1* | 12/2008 | Zhao et al. | 216/67 |
| 2009/0081860 A1 | 3/2009 | Zhou et al. | |
| 2009/0124064 A1 | 5/2009 | England et al. | 438/486 |
| 2009/0124065 A1 | 5/2009 | England et al. | 438/486 |
| 2009/0140132 A1* | 6/2009 | Lee et al. | 250/251 |
| 2009/0142875 A1 | 6/2009 | Borden et al. | |
| 2009/0152162 A1 | 6/2009 | Tian et al. | |
| 2009/0162970 A1 | 6/2009 | Yang | 438/96 |
| 2009/0206275 A1 | 8/2009 | Henley et al. | |
| 2009/0227061 A1 | 9/2009 | Bateman et al. | 438/57 |
| 2009/0227062 A1 | 9/2009 | Sullivan et al. | 438/61 |
| 2009/0227094 A1 | 9/2009 | Bateman et al. | 438/514 |
| 2009/0227095 A1 | 9/2009 | Bateman et al. | 438/514 |
| 2009/0227097 A1 | 9/2009 | Bateman et al. | 438/530 |
| 2009/0246706 A1* | 10/2009 | Hendel et al. | 430/314 |
| 2009/0289197 A1 | 11/2009 | Slocum et al. | |
| 2009/0308439 A1 | 12/2009 | Adibi et al. | |
| 2009/0308440 A1 | 12/2009 | Adibi et al. | |
| 2009/0308450 A1 | 12/2009 | Adibi et al. | |
| 2009/0309039 A1 | 12/2009 | Adibi et al. | |
| 2009/0317937 A1 | 12/2009 | Gupta et al. | 438/80 |
| 2010/0025821 A1* | 2/2010 | Ohmi et al. | 257/607 |
| 2010/0041176 A1 | 2/2010 | Sullivan et al. | 438/72 |
| 2010/0055874 A1 | 3/2010 | Henley | |
| 2010/0059362 A1 | 3/2010 | Anella | 204/192.11 |
| 2010/0110239 A1 | 5/2010 | Ramappa et al. | |
| 2010/0124799 A1 | 5/2010 | Blake et al. | |
| 2010/0159120 A1* | 6/2010 | Dzengeleski et al. | 427/8 |
| 2010/0167511 A1 | 7/2010 | Leung et al. | |
| 2010/0170440 A9* | 7/2010 | Mizukami et al. | 118/723 E |
| 2010/0178723 A1 | 7/2010 | Henley | |
| 2010/0180945 A1 | 7/2010 | Henley et al. | |
| 2010/0184243 A1 | 7/2010 | Low et al. | |
| 2010/0184248 A1 | 7/2010 | Hilali et al. | |

(56) References Cited

U.S. PATENT DOCUMENTS

| | | | |
|---|---|---|---|
| 2010/0197125 A1 | 8/2010 | Low et al. | |
| 2010/0229928 A1 | 9/2010 | Zuniga et al. | |
| 2010/0240169 A1 | 9/2010 | Petti et al. | |
| 2010/0240183 A1 | 9/2010 | Narazaki | |
| 2011/0162703 A1 | 7/2011 | Adibi et al. | |
| 2011/0192993 A1 | 8/2011 | Chun et al. | |
| 2011/0309050 A1* | 12/2011 | Iori et al. | 216/67 |
| 2012/0021136 A1* | 1/2012 | Dzengeleski et al. | 427/523 |
| 2012/0122273 A1 | 5/2012 | Chun et al. | |
| 2012/0125259 A1 | 5/2012 | Adibi et al. | |
| 2012/0129325 A1 | 5/2012 | Adibi et al. | |

FOREIGN PATENT DOCUMENTS

| | | | | |
|---|---|---|---|---|
| DE | 4217428 A1 | 6/1993 | | |
| DE | 19820152 A1 | 11/1999 | | |
| JP | 63-143876 A | 6/1988 | | |
| JP | 7-135329 A | 5/1995 | | |
| KR | 100759084 B | 9/2007 | | |
| WO | WO2009/033134 A2 | 3/2009 | | H01L 31/042 |
| WO | WO2009/033134 A3 | 3/2009 | | H01L 31/042 |
| WO | WO2009/064867 A2 | 5/2009 | | H01L 21/26 |
| WO | WO2009/064867 A3 | 5/2009 | | H01L 21/26 |
| WO | WO2009/064872 A2 | 5/2009 | | H01L 21/26 |
| WO | WO2009/064872 A3 | 5/2009 | | H01L 21/26 |
| WO | WO2009/064875 A1 | 5/2009 | | H01L 21/20 |
| WO | WO2009/085948 A2 | 7/2009 | | H01L 31/042 |
| WO | WO2009/085948 A3 | 7/2009 | | H01L 31/042 |
| WO | WO2009/111665 A2 | 9/2009 | | H01L 21/266 |
| WO | WO2009/111665 A3 | 9/2009 | | H01L 21/265 |
| WO | WO2009/111666 A2 | 9/2009 | | H01L 21/266 |
| WO | WO2009/111666 A3 | 9/2009 | | H01L 31/042 |
| WO | WO2009/111667 A2 | 9/2009 | | H01L 31/18 |
| WO | WO2009/111667 A3 | 9/2009 | | H01L 31/042 |
| WO | WO2009/111668 A2 | 9/2009 | | H01L 21/22 |
| WO | WO2009/111668 A3 | 9/2009 | | H01L 31/042 |
| WO | WO2009/111668 A9 | 9/2009 | | H01L 31/042 |
| WO | WO2009/111669 A2 | 9/2009 | | H01L 21/00 |
| WO | WO2009/111669 A3 | 9/2009 | | H01L 31/042 |
| WO | WO2009/155498 A2 | 12/2009 | | H01L 21/265 |
| WO | WO 2009-155498 A3 | 12/2009 | | |
| WO | WO2010/030645 A2 | 3/2010 | | H01L 31/042 |
| WO | WO 2010-030645 A3 | 3/2010 | | |

OTHER PUBLICATIONS

"Varian Introduces a New High-Energy Ion Implant System for Optimized Performance and Lowest Cost of Ownership," Press Release, Business Wire, Jul. 14, 1999, 1 pg.
Walther, S.R. et al., "Using Multiple Implant Regions to Reduce Development Wafer Usage,"Jan. 1, 2006, American Institute of Physics, CP866, Ion Implantation Technology, pp. 409-412.
Semiconductor Consulting Service publication: "Process Technology for the 21st Century,"Chapter 10—Substrates, Isolation, Well and Transistor Formation, Jan. 1999, downloaded from IC Knowledge.com, http://www.icknowledge.com/our_products/pt21c.html., pp. 10-1-10-4.
"Leading Semiconductor Manufacturer Selects Axcelis HE3 Ion Implantation Equipment; 300 mm Facility to Choose Axcelis Platform for High Energy Implant," Business Wire, Oct. 17, 2000, 1 pg.
Kondratenko, S. et al, "Channeling Effects and Quad Chain Implantation Process Optimization for Low Energy Boron Ions," abstract, IEEE Xplore Digital Library, Issue date: Sep. 22-27, 2002, Current version date: Jan. 7, 2004, 1 pg., downloaded from ieeexplore.ieee.org/xpl/freeabs_all.jsp?arnumber=1257941.
Nitodas, S.F., et al., "Advantages of single and mixed species chaining for high productivity in high and mid-energy implantation," published Sep. 2002, Ion Implantation Technology, Current version date Jan. 7, 2004, abstract, downloaded from ieeexplore.ieee.org., 1 pg.
Eaton Nova (Axcelis) 200E2 H/C Implanter, data sheet, 2 pgs. , Jan. 1990.
Anders, André, "Plasma and Ion Sources in Large Area Coating: A Review," Elsevier, www.sciencedirect.com, available Sep. 13, 2005, Surface and Coatings Technology 200 (2005) pp. 1893-1906.

Vervish et al., "Plasma Immersion Ion Implantation Applied to P+N Junction Solar Cells", CP866, Ion Implantation Technology, American Institute of Physics, vol. 866, Jan. 2006, pp. 253-256.
Anders "Plasma and Ion Sources in Large Area Coating: A Review", www.sciencedirect.com, Surface Coatings & Technology, Nov. 21, 2005, vol. 200, Issues: 5-6, pp. 1893-1906, Berkeley CA.
Armini et al., "Nuclear Instruments and Methods in Physics Research B6", Jan. 1985, vol. 94-99, 1 Page, North-Holland, Amsterdam, Spire Corporation, Patriots Park, Bedford, Masachusetts 01730, USA.
Comet et al., "A New Algorithm for Charge Deposition for Multiple-Grid Method for PIC Simulations in r-z Cylindrical Coordinates", www.sciencedirect.com, Journal of Computational Physics, Jul. 1, 2007vol. 225, Issue: 1, pp. 808-828, Sydney, Australia.
Com-Nougue et al., "Cw Co2 Laser Annealing Associated with Ion Implantation for Production of Silicon Solar Cell Junctions", Jan. 1982, IEEE, p. 770.
Douglas et al., "A Study of the Factors Which Control the Efficiency of Ion-Implated Silicon Solar Cells", IEEE Transactions on Electron Devices, vol. ED-27, No. 4, Apr. 1980, pp. 792-802.
Fu et al., "Enhancement of Implantation Energy Using a Conducting Grid in Plasma Immersion Ion Implantation of Dielectric/Polymeric Materials", Review of Scientific Instruments, vol. 74, No. 8, Aug. 2003, pp. 3697-3700.
Goeckner et al., "Plasma Doping for Shallow Junctions", Journal of Vacuum Science and Technology B, vol. 17, Issue: 5, Sep. 1999, pp. 2290-2293.
Jager-Hezel, "Developments for Large-Scale Production of High-Efficiency Silicon Solar Cells," Advances in Solid State Physics, vol. 34, Jan. 1994, pp. 97-113, <http://www.springerlink.com/content/982620t312416v/>.
Kwok et al., "One-Step, Non-Contact Pattern Transfer by Direct-Current Plasma Immersion Ion Implantation", Journal of Physics D: Applied Physics, IOP Publishing, vol. 42, No. 19, Sep. 2009, pp. 1-6.
Kwok et al., "One-Step Non-Contact Pattern Transferring by Plasma Based Ion Implantation", Journal of Physics D: Applied Physics, IOP Publishing, vol. 41, No. 22, Oct. 2008, pp. 1-6.
Minnucci et al., "Tailored Emitter, Low-Resistivity, Ion-Implanted Silicon Solar Cells", IEEE Transactions on Electron Devices, vol. ED-27, No. 4, Apr. 1980, pp. 802-806.
Nielsen, "Ion Implanted Polycrystalline Silicon Solar Cells", Physica Scripta, vol. 24, No. 2, Aug. 1, 1981, pp. 390-391.
Pelletier et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.
Sopian et al., "Plasma Implantation for Emitter and Localized Back Surface Field (BSF) Formation in Silicon Solar Cells", European Journal of Scientific Research, http://www.eurojournals.com/ejsr.htm, ISSN 1450-216X, vol. 24, No. 3, Jan. 2008, pp. 365-372.
Tang et al., "Current Control for Magnetized Plasma in Direct-Current Plasma-Immersion Ion Implantation", American Institute of Physics, Applied Physics Letters, vol. 82, No. 13, Mar. 31, 2003, pp. 2014-2016.
Xu et al., "Etching of Nanopatterns in Silicon Using Nanopantography", Applied Physics Letters, vol. 92, Jan. 9, 2008, pp. 1-3.
Xu et al., "Nanopantography: A New Method for Massively Parallel Nanopatterning Over Large Areas", Nano Letters, vol. 5, No. 12, Jan. 2005, pp. 2563-2568.
Yankov et al., "Plasma Immersion Ion Implantation for Silicon Processing", Annalen der Physik, vol. 10, Issue: 4, Feb. 2001, pp. 279-298.
Young et al., "High-Efficiency Si Solar Cells by Beam Processing", Applied Physics Letters, vol. 43, Issue: 7, Oct. 1, 1983, pp. 666-668.
Zeng et al., "Steady-State, Direct-Current (DC) Plasma Immersion Ion Implantation (PIII) for Planar Samples", IEEE, Jan. 2000, pp. 515-519.
Zeng, et al., "Steady-State Direct-Current Plasma Immersion Ion Implantation Using an Electron Cyclotron Resonance Plasma Source", Thin Solid Films, www.elsevier.com/locate/tsf, vol. 390, Issues: 1-2, Jun. 30, 2001, pp. 145-148.
In the Unites States Patent and Trademark Office, U.S. Appl. No. 61/033,873, filed Mar. 5, 2008, Entitled:."Use of Chained Implants in

(56) References Cited

OTHER PUBLICATIONS

Solar Cells", First Named Inventor: Nicholas Bateman, Company: Varian Semiconductor Equipment Associates, Inc., Gloucester, Massachusetts.

In the Unites States Patent and Trademark Office, U.S. Appl. No. 61/095,010, filed Sep. 8, 2008, Entitled: "Use of Dopants With Different Diffusivities for Solar Cell Manufacture", First Named Inventor: Nicholas Bateman, Company: Varian Semiconductor Equipment Associates, Inc., Gloucester, Massachusetts.

Donnelly et al., "Nanopantography: A Method for Parallel Writing of Etched and Deposited Nanopatterns", Oct. 2009, University of Houston. Houston, TX, 36 pages.

Rentsch, J. et al., "Technology Route towards Industrial Application of Rear Passivated Silicon Solar Cells," May 2006, IEEE pp. 1008-1011.

Examination Report in 048635-108068 dated Jul. 26, 2012 (Singapore Application No. 201009185-8).

Jacques et al., "Plasma-Based Ion Implantation and Deposition: A Review of Physics, Technology, and Applications", http://www.escholarship.org/uc/item/84k974r2, Lawrence Berkeley National Laboratory, May 16, 2005, pp. 1-69.

Notice of Allowance and Fee(s) Due in 048635-108000 dated Sep. 6, 2012 U.S. Appl. No. 12/482,685).

"Notification of Transmittal of The International Search Report and The Written Opinion of The International Searching Authority, or The Declaration," Date of mailing: Apr. 6, 2011, International Application No. PCT/US11/24244, International Filing Date: Feb. 9, 2011, Authorized Officer: Blaine R. Copenheaver, pp. 1-9.

"Notification of Transmittal of The International Search Report and The Written Opinion of The International Searching Authority, or The Declaration," Date of mailing: May 25, 2010, International Application No. PCT/US10/28058, International Filing Date: Mar. 19, 2010, Authorized Officer: Lee W. Young, 048635-108401, pp. 1-9.

"Notification of Transmittal of The International Search Report and The Written Opinion of The International Searching Authority, or The Declaration," Date of mailing: Oct. 2, 2009, International Application No. PCT/US09/47094, International Filing Date: Jun. 11, 2009, Authorized Officer: Blaine R. Copenheaver, pp. 1-15.

"Notification of Transmittal of The International Search Report and The Written Opinion of The International Searching Authority, or The Declaration," Date of mailing: Aug. 4, 2009, International Application No. PCT/US09/47102, International Filing Date: Jun. 11, 2009, Authorized Officer: Lee W. Young, pp. 1-11.

"Notification of Transmittal of The International Search Report and The Written Opinion of The International Searching Authority, or The Declaration," Date of mailing: Jul. 29, 2009, International Application No. PCT/US09/47109, International Filing Date. Jun. 11, 2009, Authorized Officer: Lee. W. Young, pp. 1-11.

"Notification of Transmittal of The international Search Report and The Written Opinion of The International Searching Authority, or The Declaration," Date of mailing: Jul. 31, 2009, International Application No. PCT/US09/47090, International Filing Date: Jun. 11, 2009, Authorized Officer: Lee W. Young, pp. 1-10.

"Notification of Transmittal of The International Search Report and The Written Opinion of The International Searching Authority, or The Declaration," Date of mailing: Mar. 29, 2012, International Application No. PCT/US11/61274, International Filing Date: Nov. 17, 2011, Authorized Officer: Lee W. Young, pp. 1-9.

Office Action (Non-Final) dated Feb. 28, 2012 (U.S. Appl. No. 12/482,685).

Office Action (Final) dated Jun. 6, 2012 (U.S. Appl. No. 12/482,685).

Office Action (Non-Final) dated Jun. 7, 2012 (U.S. Appl. No. 12/482,947).

Office Action (Non-Final) dated Aug. 24, 2012 (U.S. Appl. No. 12/482,980).

Office Action (Non-Final) dated Aug. 31, 2012 (Chinese Application No. 200980127945.7).

Office Action (Non-Final) dated Sep. 25, 2012 (U.S. Appl. No. 12/483,017).

Restriction Requirement dated Feb. 1, 2012 (U.S. Appl. No. 12/482,685).

Restriction Requirement dated Apr. 24, 2012 (U.S. Appl. No. 12/482,980).

Restriction Requirement dated Apr. 25, 2012 (U.S. Appl. No. 12/483,017).

Restriction Requirement dated Oct. 5, 2012 (U.S. Appl. No. 12/728,105).

Written Opinion dated May 10, 2012, (Singapore Patent Application No. 201106457-3).

Younger et al, "Ion Implantation Processing for High Performance Concentrator Solar Cells and Cell Assemblies," Solar Cells, vol. 6, 1982, pp. 79-86.

Notice of Allowance and Fee(s) Due dated Sep. 6, 2012 (U.S. Appl. No. 12/482,685).

"Notification of Transmittal of The International Search Report and The Written Opinion of The International Searching Authority, or The Declaration," Date of mailing: May 25, 2010, International Application No. PCT/US10/28058, International Filing Date: Mar. 19, 2010, Authorized Officer: Lee W. Young, pp. 1-9.

"Notification of Transmittal of The International Search Report and The Written Opinion of The International Searching Authority, or The Declaration," Date of mailing: Jul. 29, 2009, International Application No. PCT/US09/47109, International Filing Date: Jun. 11, 2009, Authorized Officer: Lee W. Young, pp. 1-11.

Office Action (Non-Final) Jun. 7, 2012 (U.S. Appl. No. 12/482,947).

"Implantation par Immersion Plasma (PULSION®)," Ion Beam Services (IBS), ZI Peynier Rousset, France, Dec. 2008.

Janssens et al., "Advanced Phosphorus Emitters for High Efficiency SI Solar Cells," 24th European Photovoltaic Solar Energy Conference, Hamburg, Germany Sep. 21-25, 2009.

Neuhaus et al., "Industrial Silicon Wafer Solar Cells," Hindawi Publishing Corporation, vol. 2007, pp. 1-15, Sep. 14, 2007.

Nikiforov et al., "Large Volume ICP Sources for Plasma-Based Accelerators," Korea Electrotechnology Research Institute (KERI), APAC 2004, Gyeongju, Korea.

Office Action (Non-Final) dated Dec. 5, 2012 (Chinese Application No. 200980128201.7).

Office Action (Non-Final) dated Jan. 14, 2013 (U.S. Appl. No. 12/728,105).

Office Action (Non-Final) dated Jan. 16, 2013 (U.S. Appl. No. 12/821,053).

Office Action (Non-Final) dated Jan. 28, 2013 (U.S. Appl. No. 12/482,685).

Steckl, "Particle-Beam Fabrication and in Situ Processing of Integrated Circuits," Proceedings of the IEEE, vol. 74, Issue 12.

Written Opinion dated Jun. 8, 2012, (Singapore Patent Application No. 201009191-6).

Written Opinion dated Jun. 8, 2012, (Singapore Patent Application No. 201009194-0).

Written Opinion dated Jan. 11, 2013, (Singapore Patent Application No. 201106457-3).

Xu, et al., Nanopantography results: continuous writing of etched Si 'nano-Ts' with $AR^+ / CI_2$.

\* cited by examiner

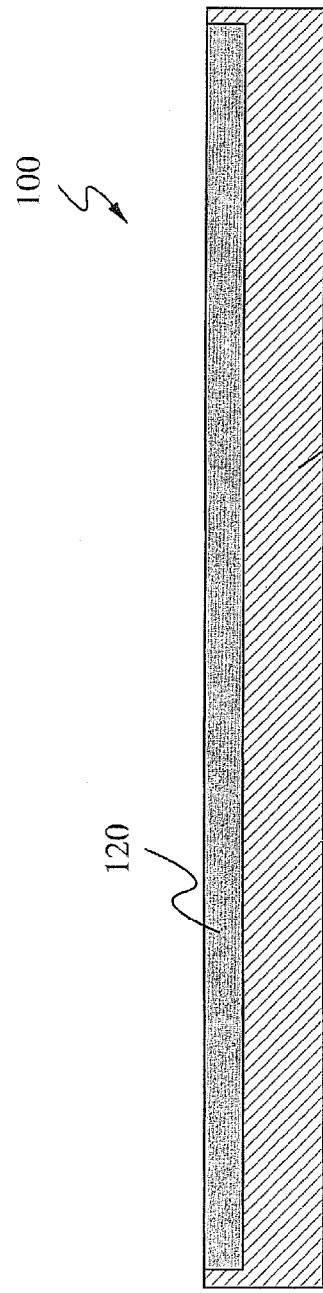
Fig. 1
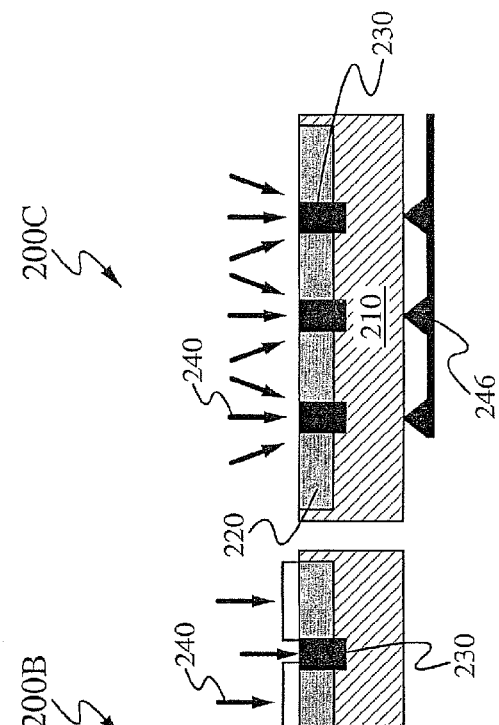
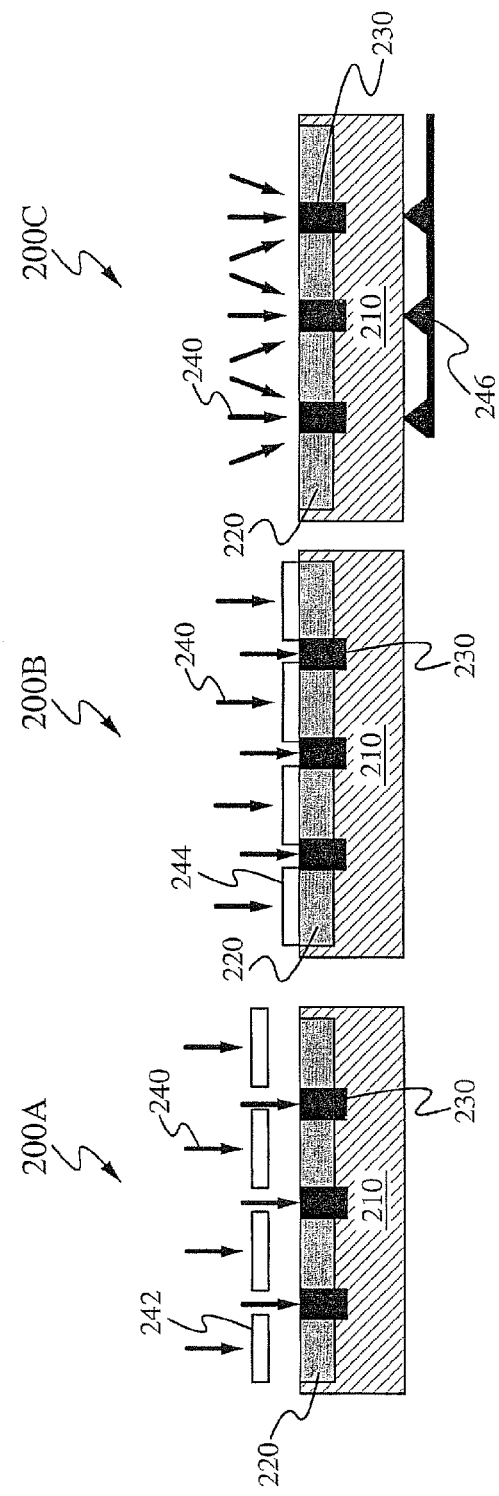
Fig. 2A  Fig. 2B  Fig. 2C

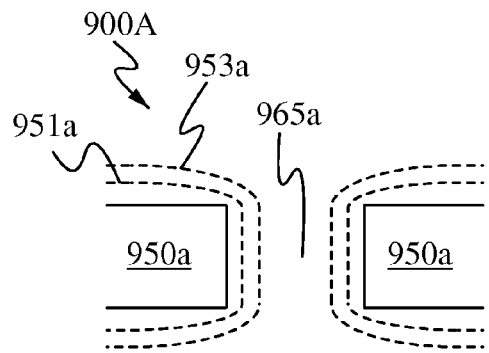
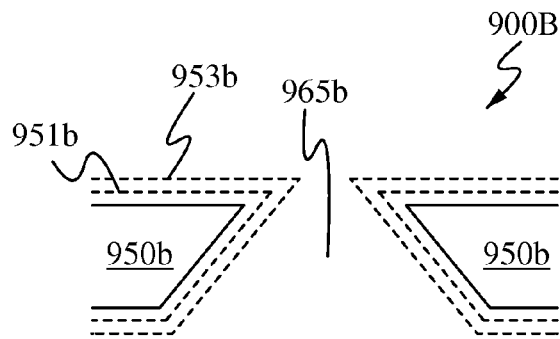
Fig. 9A                Fig. 9B
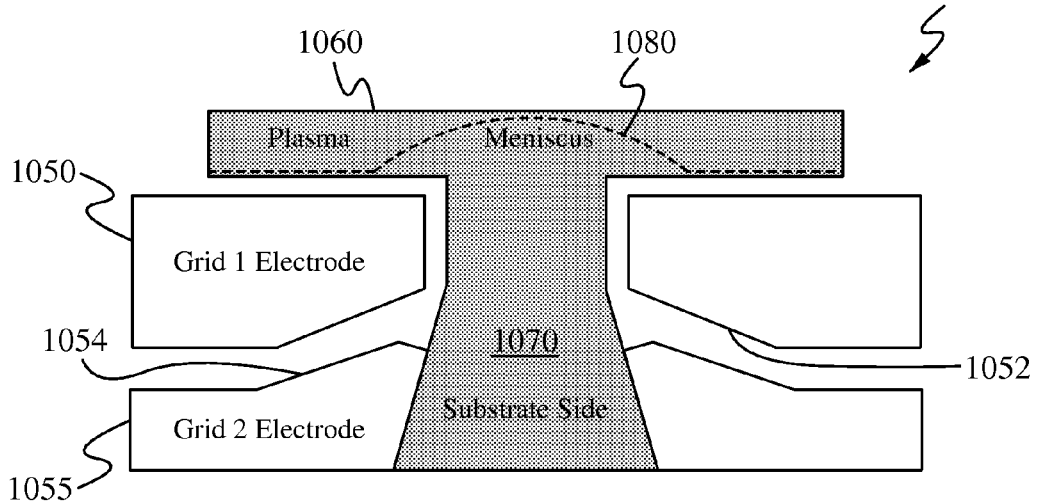
Fig. 10
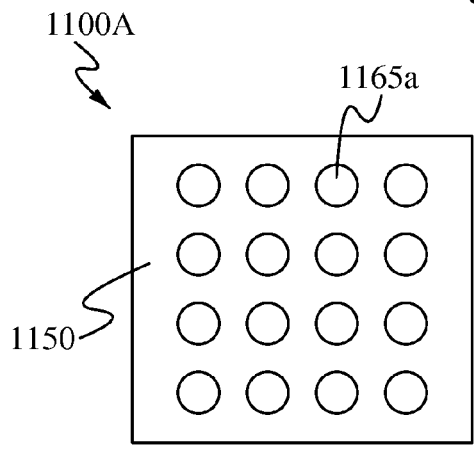
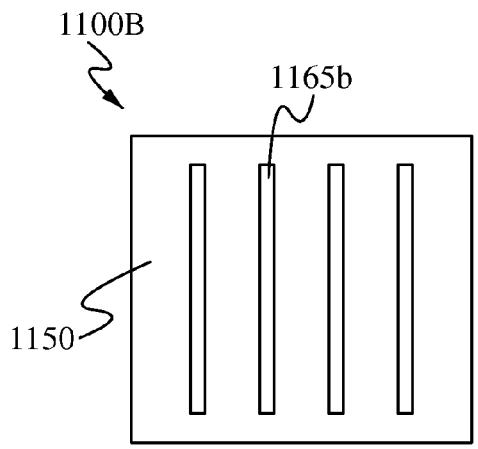
Fig. 11A              Fig. 11B

PLASMA GRID IMPLANT SYSTEM FOR USE IN SOLAR CELL FABRICATIONS

CROSS-REFERENCE TO RELATED APPLICATIONS

This application claims priority to co-pending U.S. Provisional Application Ser. No. 61/219,379, filed Jun. 23, 2009, entitled "PLASMA GRID IMPLANT SYSTEM FOR USE IN SOLAR CELL FABRICATIONS," which is hereby incorporated by reference in its entirety as if set forth herein.

FIELD OF THE INVENTION

The present invention relates generally to the field of solar cells and other large substrate implant applications. More particularly, the present invention relates to solar cell devices and methods of their formation.

BACKGROUND OF THE INVENTION

Although traditional beamline implantation of wafers can provide high power density, it has several disadvantages. For example, it only provides a single beamlet. Additionally, it uses a lot of power in a small beam spot, and the wafer gets quite hot. As a result, productivity is low.

SUMMARY OF THE INVENTION

In one aspect of the present invention, a plasma grid implantation system is provided. The system comprises: a plasma source configured to provide plasma; a first grid plate comprising a plurality of apertures configured to allow ions from the plasma in a plasma region to pass therethrough, wherein the first grid plate is configured to be positively biased, either continuously in DC mode or in pulsed mode, by a power supply; a second grid plate comprising a plurality of apertures configured to allow the ions to pass therethrough subsequent to the ions passing through the first grid plate, wherein the second grid plate is configured to be negatively biased, either continuously in DC mode or in pulsed mode, by a power supply; and a substrate holder configured to support a substrate in a position where the substrate is implanted with the ions subsequent to the ions passing through the second grid plate.

In some embodiments, the position of at least one of the first grid plate, the second grid plate, and the substrate holder is configured to be adjusted between a homogeneous implantation position and a selective implantation position, the homogeneous implantation position is configured to enable a single laterally-homogeneous ion implantation across the substrate on the substrate holder, wherein the single laterally-homogeneous ion implantation is formed from a combination of ions that have passed through different apertures of the second grid plate, and the selective implantation position is configured to enable a plurality of laterally spaced-apart ion implantations of the substrate on the substrate holder, wherein the plurality of laterally spaced-apart ion implantations is formed from ions that have passed through the different apertures of the second grid plate.

In some embodiments, the system further comprises a third grid plate disposed between the second grid plate and the substrate holder, and the third grid plate comprises a plurality of apertures configured to allow the ions to pass therethrough subsequent to the ions passing through the second grid plate. In some embodiments, the third grid plate is grounded. In some embodiments, the position of at least one of the third grid plate and the substrate holder is configured to be adjusted between a homogeneous implantation position and a selective implantation position, the homogeneous implantation position configured to enable a single laterally-homogeneous ion implantation across the substrate on the substrate holder, wherein the single laterally-homogeneous ion implantation is formed from a combination of ions that have passed through different apertures of the second grid plate, and the selective implantation position configured to enable a plurality of laterally spaced-apart ion implantations of the substrate on the substrate holder, wherein the plurality of laterally spaced-apart ion implantations is formed from ions that have passed through the different apertures of the second grid plate.

In some embodiments, the apertures of at least one of the first grid plate and the second grid plate are substantially circular holes. In some embodiments, the apertures of at least one of the first grid plate and the second grid plate are elongated slots. In some embodiments, each one of the apertures of at least one of the first grid plate and the second grid plate comprises a top end and a bottom end, wherein the bottom end is closer to the substrate holder than the top end, and wherein the diameter of each aperture gradually increases from the top end to the bottom end.

In some embodiments, the first grid plate and the second grid plate comprise a material chosen from the group consisting of: silicon, graphite, silicon carbide, and tungsten. In some embodiments, the system further comprises a chamber defined by chamber walls, wherein the plasma region, the first grid plate, and the second grid plate are housed within the chamber, and wherein the chamber walls are configured to repel ions in the plasma region using a magnetic field. In some embodiments, one or more magnets are coupled to the chamber walls.

In another aspect of the present invention, a method of ion implantation is provided. The method comprises: providing a plasma within a plasma region of a chamber; positively biasing a first grid plate, wherein the first grid plate comprises a plurality of apertures and is disposed in a first position; negatively biasing a second grid plate, wherein the second grid plate comprises a plurality of apertures and is disposed in a first position; flowing ions from the plasma in the plasma region through the apertures in the positively-biased first grid plate; flowing at least a portion of the ions that flowed through the apertures in the positively-biased first grid plate through the apertures in the negatively-biased second grid plate; and implanting a substrate with at least a portion of the ions that flowed through the apertures in the negatively-biased second grid plate, wherein the substrate is disposed in a first position.

In some embodiments, a shadow mask comprising a plurality of openings formed therethrough is disposed a predetermined distance away from the substrate, and the method further comprises flowing at least a portion of the ions that flowed through the apertures in the negatively-biased second grid plate through the openings in the shadow mask before implanting the substrate.

In some embodiments, a photoresist mask comprising a plurality of openings formed therethrough is placed in contact with the substrate, and the method further comprises flowing at least a portion of the ions that flowed through the apertures in the negatively-biased second grid plate through the openings in the photoresist mask before implanting the substrate.

In some embodiments, the method further comprises: adjusting the position of at least one of the first grid plate, second grid plate, and the substrate holder to a second position; providing a plasma within the plasma region subsequent to the adjustment to the second position; flowing ions from the plasma in the plasma region through the apertures in the positively-biased first grid plate subsequent to adjustment to the second position; flowing at least a portion of the ions that flowed through the apertures in the positively-biased first grid plate through the apertures in the negatively-biased second grid plate subsequent to adjustment to the second position; and implanting a substrate with at least a portion of the ions that flowed through the apertures in the negatively-biased second grid plate subsequent to adjustment to the second position, wherein the implantation performed when the at least one of the first grid plate, second grid plate, and the substrate holder was in the first position forms a single laterally-homogeneous ion implantation across the substrate, wherein the single laterally-homogeneous ion implantation is formed from a combination of ions that have passed through different apertures of the second grid plate, and wherein the implantation performed when the at least one of the first grid plate, second grid plate, and the substrate holder was in the second position forms a plurality of laterally spaced-apart ion implantations of the substrate, wherein the plurality of laterally spaced-apart ion implantations is formed from ions that have passed through the different apertures of the second grid plate.

In some embodiments, a third grid plate is disposed between the second grid plate and the substrate, the third grid plate is disposed in a first position and comprises a plurality of apertures configured to allow the ions to pass therethrough subsequent to the ions passing through the second grid plate. In some embodiments, the third grid plate is grounded. In some embodiments, the method further comprises: adjusting the position of at least one of the first grid plate, second grid plate, the third grid plate, and the substrate holder to a second position; providing a plasma within the plasma region subsequent to the adjustment to the second position; flowing ions from the plasma in the plasma region through the apertures in the positively-biased first grid plate subsequent to adjustment to the second position; flowing at least a portion of the ions that flowed through the apertures in the positively-biased first grid plate through the apertures in the negatively-biased second grid plate subsequent to adjustment to the second position; flowing at least a portion of the ions that flowed through the apertures in the negatively-biased second grid plate through the apertures in the third grid plate subsequent to adjustment to the second position; and implanting a substrate with at least a portion of the ions that flowed through the apertures in the third grid plate subsequent to adjustment to the second position, wherein the implantation performed when the at least one of the first grid plate, second grid plate, the third grid plate, and the substrate holder was in the first position forms a single laterally-homogeneous ion implantation across the substrate, wherein the single laterally-homogeneous ion implantation is formed from a combination of ions that have passed through different apertures of the third grid plate, and wherein the implantation performed when the at least one of the first grid plate, second grid plate, the third grid plate, and the substrate holder was in the second position forms a plurality of laterally spaced-apart ion implantations of the substrate, wherein the plurality of laterally spaced-apart ion implantations is formed from ions that have passed through the different apertures of the third grid plate.

In some embodiments, the apertures of at least one of the first grid plate and the second grid plate are substantially circular holes. In some embodiments, the apertures of at least one of the first grid plate and the second grid plate are elongated slots. In some embodiments, each one of the apertures of at least one of the first grid plate and the second grid plate comprises a top end and a bottom end, wherein the bottom end is closer to the substrate holder than the top end, and wherein the diameter of each aperture gradually increases from the top end to the bottom end.

In some embodiments, the first grid plate and the second grid plate comprise a material chosen from the group consisting of: silicon, graphite, silicon carbide, and tungsten. In some embodiments, the plasma region, the first grid plate, and the second grid plate are housed within a chamber that is defined by chamber walls, and wherein the chamber walls are configured to repel ions in the plasma region using an electric field.

In some embodiments, the method further comprises the step of applying a pulsed voltage to the plasma. In some embodiments, the method further comprises the step of applying a pulsed voltage to the substrate. In some embodiments, the pulsed voltage is directed towards a plurality of different locations on the substrate.

In some embodiments, the method further comprises: passing the substrate through a first plurality of differentially-pumped stages prior to the substrate being implanted with the ions, wherein each stage in the first plurality of differentially-pumped stages comprises a lower pressure than the previous stage in the first plurality of differentially-pumped stages; passing the substrate from the first plurality of differentially pumped stages directly to an implantation stage; passing the substrate from the implantation stage directly to a second plurality of differentially-pumped stages subsequent to the substrate being implanted with the ions, and passing the substrate through the second plurality of differentially-pumped stages, wherein each stage in the second plurality of differentially-pumped stages comprises a higher pressure than the previous stage in the second plurality of differentially-pumped stages, wherein the implantation stage comprises a lower pressure than any of the stages in the first plurality and second plurality of differentially-pumped stages.

In yet another aspect of the present invention, a plasma grid implantation system is provided. The system comprises: a plasma source configured to provide plasma; a grid assembly comprising a plurality of grid plates, wherein each grid plate comprises a plurality of apertures configured to allow ions from the plasma to pass therethrough; and a substrate holder configured to support a substrate in a position where the substrate is implanted with the ions subsequent to the ions passing through the plurality of apertures of the grid plates, wherein at least one of the substrate holder and the grid plates is configured to be adjusted between a homogeneous implantation position and a selective implantation position, wherein the homogeneous implantation position is configured to enable a single laterally-homogeneous ion implantation across the substrate on the substrate holder, the single laterally-homogeneous ion implantation being formed from a combination of ions that have passed through different apertures of the second grid plate, and wherein the selective implantation position is configured to enable a plurality of laterally spaced-apart ion implantations of the substrate on the substrate holder, the plurality of laterally spaced-apart ion implantations is formed from ions that have passed through the different apertures of the second grid plate.

In some embodiments, the plurality of grid plates comprises: a first grid plate comprising a plurality of apertures configured to allow ions from the plasma in a plasma region to pass therethrough; and a second grid plate comprising a plurality of apertures configured to allow the ions to pass therethrough subsequent to the ions passing through the first grid plate. In some embodiments, the first grid plate is configured to be positively-biased by a power supply. In some embodiments, the second grid plate is configured to be negatively-biased by a power supply. In some embodiments, the plurality of grid plates further comprises a third grid plate comprising a plurality of apertures configured to allow the ions to pass therethrough subsequent to the ions passing through the second grid plate. In some embodiments, the third grid plate is configured to be grounded. In some embodiments, the first grid plate, the second grid plate, and the substrate holder are all configured to have their positions adjusted.

In yet another aspect of the present invention, a method of ion implantation is provided. The method comprises: providing a plasma within a plasma region of a chamber; providing a grid assembly comprising a plurality of grid plates, wherein each grid plate comprises a plurality of apertures; flowing a first set of ions from the plasma in the plasma region through the apertures in each of the grid plates in the grid assembly while each of the grid plates is in a first position; homogeneously implanting a substrate with at least a portion of the first set of ions that flowed through the apertures in the grid plates while the substrate is supported in a first position by a substrate holder, thereby forming a single laterally-homogeneous ion implantation across the substrate from a combination of the first set of ions that have passed through different apertures of the same grid plate; adjusting the position of the substrate or at least one of the grid plates to a second position; flowing a second set of ions from the plasma in the plasma region through the apertures in each of the grid plates in the grid assembly subsequent to the adjustment to the second position; selectively implanting the substrate with at least a portion of the second set of ions that flowed through the apertures in the grid plates subsequent to the adjustment to the second position, thereby forming a plurality of laterally spaced-apart ion implantations on the substrate from a portion of the second set of ions that have passed through different apertures of the same grid plate.

In some embodiments, the adjusting step comprises adjusting the position of the substrate. In some embodiments, adjusting the position of the substrate comprises moving the substrate closer to the grid assembly.

In some embodiments, the adjusting step comprises adjusting the position of one of the grid plates. In some embodiments, adjusting the position of one of the grid plates comprises moving one of the grid plates closer to the substrate.

In some embodiments, the plurality of grid plates comprises a first grid plate and a second grid plate, the first grid plate being positively-biased, and the second grid plate being negatively biased. In some embodiments, the plurality of grid plates further comprises a third grid plate that is grounded.

In yet another aspect of the present invention, a method of ion implantation is provided. The method comprises: providing a first single type of dopant material to a plasma generator; the plasma generator breaking up the first single type of dopant material into a first plurality of dopant species; and implanting a substrate with the first plurality of dopant species.

In some embodiments, the substrate is implanted with the first plurality of dopant species in a single implantation step. In some embodiments, each one of the dopant species is implanted into the substrate at a different depth. In some embodiments, the first single type of dopant material is phosphine. In some embodiments, the first plurality of dopant species comprises $P^+$, $P^{++}$, $P^{+++}$, $P_2^+$, $P_3^+$, and $P_5^+$. In some embodiments, the first single type of dopant material is boron or arsenic.

In some embodiments, a combination of different types of dopant material is used to implant different pluralities of dopant species. In some embodiments, the different types of dopant material can be provided in precursor form as gasses, liquids, solids, or any combination thereof.

In some embodiments, a second single type of dopant material is provided to the plasma generator, the plasma generator breaks up the second single type of dopant material into a second plurality of dopant species during the same period that the plasma generator breaks up the first single type of dopant material into the first plurality of dopant species, and the second plurality of dopant species is implanted into the substrate during the same period that the first plurality of dopant species is implanted into the substrate. In some embodiments, the first single type of dopant material and the second single type of dopant material are each a precursor gas. In some embodiments, the first single type of dopant material is arsine and the second single type of dopant material is phosphine.

BRIEF DESCRIPTION OF THE DRAWINGS

FIG. 1 illustrates a cross-sectional side view of one embodiment of a homogeneously doped solar cell in accordance with the principles of the present invention.

FIGS. 2A-2C illustrate cross-sectional side views of different ways of selectively implanting a solar cell in accordance with the principles of the present invention.

FIGS. 9A-9B illustrate cross-sectional side views of different grid plate apertures in accordance with the principles of the present invention.

FIG. 10 illustrates a cross-sectional side view of one embodiment of plasma ions passing through grid plates in accordance with the principles of the present invention.

FIGS. 11A-11B illustrate plan views of different grid plate apertures in accordance with the principles of the present invention.

DETAILED DESCRIPTION OF THE INVENTION

Figure 3:
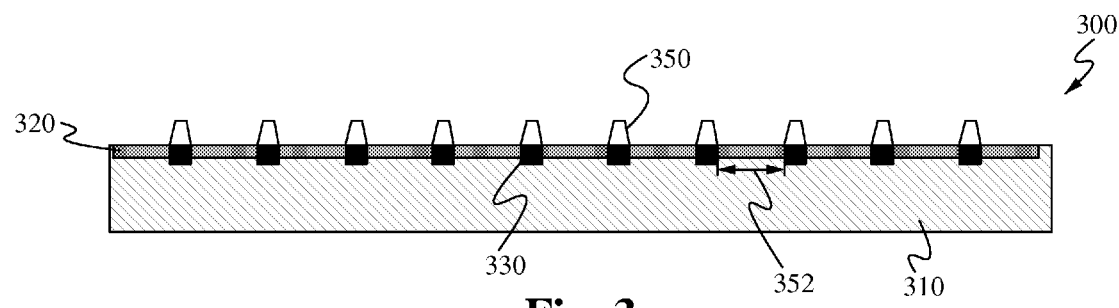
FIG. 3 illustrates a cross-sectional side view of one embodiment of a solar cell with contact gridlines in accordance with the principles of the present invention.

The following description is presented to enable one of ordinary skill in the art to make and use the invention and is provided in the context of a patent application and its requirements. Various modifications to the described embodiments will be readily apparent to those skilled in the art and the generic principles herein may be applied to other embodiments. Thus, the present invention is not intended to be limited to the embodiment shown but is to be accorded the widest scope consistent with the principles and features described herein.

Furthermore, it is contemplated that any features from any embodiment can be combined with any features from any other embodiment. In this fashion, hybrid configurations of the illustrated embodiments are well within the scope of the present invention.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Additionally, it is contemplated that method steps can be performed in a different order than the order illustrated in the figures, unless otherwise disclosed explicitly or implicitly.

The present invention is directed towards an implant system that is not only tailored for the manufacturing of solar cells, but for semiconductor and other surface and near-surface modification applications as well. The development of this system is based on the relaxed specifications that solar cell fabrications require. It can provide accurate doping and unique atomic profile tailoring capability for solar cells (incorporating features from commonly-owned U.S. patent application Ser. No. 12/483,017, entitled "FORMATION OF SOLAR CELL-SELECTIVE EMITTER USING IMPLANT AND ANNEAL METHOD," filed Jun. 11, 2009, and from commonly-owned U.S. Provisional Application No. 61/131,698, entitled "FORMATION OF SOLAR CELL-SELECTIVE EMITTER USING IMPLANT AND ANNEAL METHOD," filed Jun. 11, 2008, which are both hereby incorporated by reference as if set forth herein). These include change in doping levels, resistance of contact, bus bar, fingers, contact resistance of metal-silicon interface, resistance of backside metallization, achieving the desired resistivity under the metal grid contact (preferably 10 to 30 Ohms/Sq.) and in between the fingers (preferably greater than 100 Ohms/Sq.) to meet higher efficiency solar cells (incorporating features from commonly-owned U.S. patent application Ser. No. 12/482,980, entitled "SOLAR CELL FABRICATION USING IMPLANTATION," filed Jun. 11, 2009, commonly-owned U.S. Provisional Application No. 61/131,687, entitled "SOLAR CELL FABRICATION USING IMPLANTATION," filed Jun. 11, 2008, commonly-owned U.S. patent application Ser. No. 12/482,685, entitled "SOLAR CELL FABRICATION WITH FACETING AND ION IMPLANTATION," filed Jun. 11, 2009, and commonly-owned U.S. Provisional Application No. 61/133,028, entitled "SOLAR CELL FABRICATION WITH FACETING AND ION IMPLANTATION," filed Jun. 24, 2008, which are all hereby incorporated by reference as if set forth herein). It also meets the demands of future requirements for solar cell wafer thickness, as well as contact metal width and spacing.

Moreover, the advantageous formation of selective emitter and Back Surface Field (BSF) and its ability to improve performance will be possible (incorporating features from commonly-owned U.S. patent application Ser. No. 12/482,947, entitled "APPLICATION SPECIFIC IMPLANT SYSTEM AND METHOD FOR USE IN SOLAR CELL FABRICATIONS," filed Jun. 11, 2009, commonly-owned U.S. Provisional Application No. 61/131,688, entitled "APPLICATIONS SPECIFIC IMPLANT SYSTEM AND METHOD FOR USE IN SOLAR CELL FABRICATIONS," filed Jun. 11, 2008, commonly-owned U.S. Provisional Application Ser. No. 61/210,545, entitled "ADVANCED HIGH EFFICIENCY CRYSTALLINE SOLAR CELL FABRICATION METHOD," filed Mar. 20, 2009, and commonly-owned U.S. patent application Ser. No. 12/728,105, entitled "ADVANCED HIGH EFFICIENCY CRYSTALLINE SOLAR CELL FABRICATION METHOD," filed Mar. 19, 2010). The present invention can be applied to as-grown single or mono-crystalline, poly or multi-crystalline or electrical-grade or metallurgical-grade silicon, as well as very thin silicon wafers and very thin film deposited silicon, or other materials used for solar cell formation and other applications. The present invention can also be applied to multi junction devices, and can be extended to atomic species placement for any other material used in fabrication of junctions and metal semiconductor interface enhancements.

Figure 5:
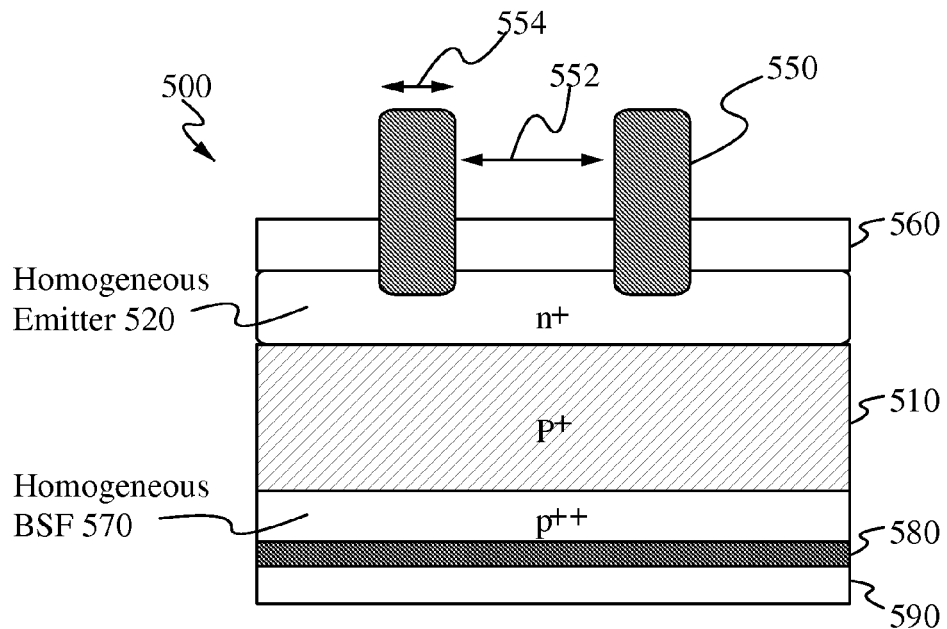
FIG. 5 illustrates a cross-sectional side view of one embodiment of a solar cell with a homogeneous implant in accordance with the principles of the present invention.

FIG. 5 illustrates a cross-sectional side view of one embodiment of a solar cell 500 with a homogeneous implant in accordance with the principles of the present invention. Solar cell 500 comprises a semiconducting wafer with a p-doped region 510 and an n-doped region 520. The n-doped region 520 is homogeneously doped to form a homogeneous emitter. An anti-reflective coating 560 is disposed over the n-doped region 520. The anti-reflective coating 560 preferably has a thickness of between 70-80 nm. Metal contacts 550 are deposited onto the wafer, preferably having a width 554 of between 3-200 microns and being spaced apart by a width 552 of between 1-3 mm. A p-doped region 570 is formed in the wafer on the opposite side from the n-doped region 520, forming a homogeneous BSF. A passivation layer 580 (e.g., $Si_3N_4$ or $Al_2O_3$) is disposed over the bottom surface of the p-doped region 570, and a rear metal contact layer 590 (e.g., Ag) is disposed over the bottom surface of the passivation layer 580.

Figure 6:
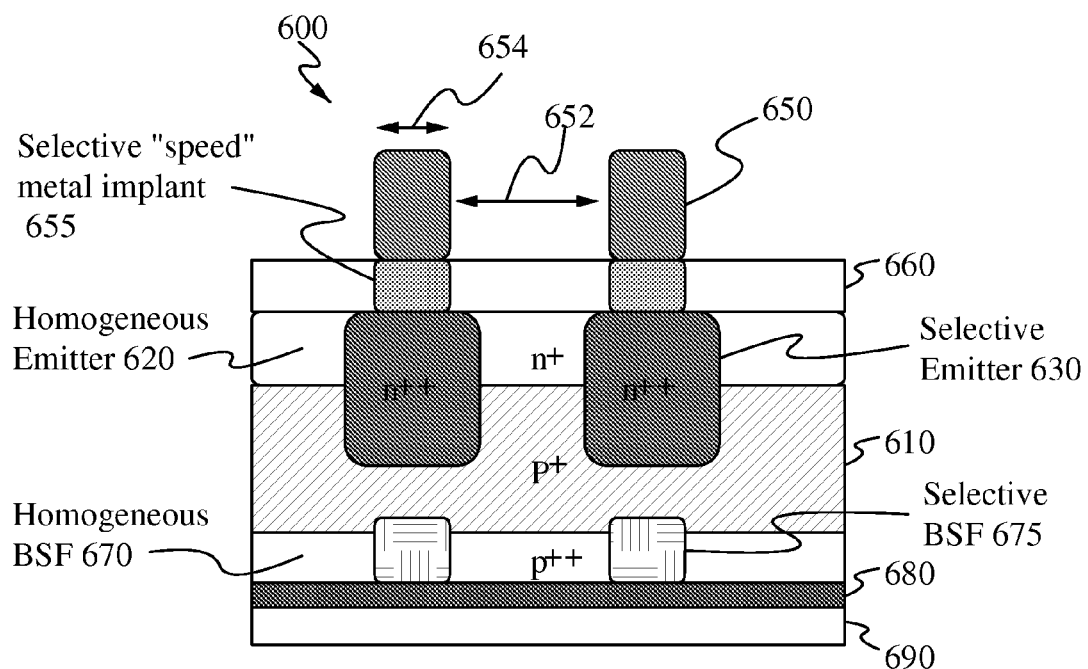
FIG. 6 illustrates a cross-sectional side view of another embodiment of a solar cell with homogeneous and selective implants in accordance with the principles of the present invention.

FIG. 6 illustrates a cross-sectional side view solar cell 600, which is solar cell 500 with the addition of certain selective implants. These selective implants include n-doped selective emitter regions 630, selective metallic seed implants 655, and selective BSF regions 675.

In some embodiments, the present invention includes the use of ions in gas plasma that are accelerated to the substrate by the application of pulses of negative potential to the substrate. The plasma is transitioned into a sheath at the proximity of the substrate, and applications of a potential cause acceleration of ions resident in the plasma to be implanted. Such conformal doping of the substrate can be utilized to form homogenous doped regions, as well as selectively doped regions through the use of a mask or other selective implantation techniques. At the same time, the dopant profile can be tailored to provide independent surface concentrations, shape of the profile, and the junction depth, through pulse shape and plasma component adjustments. Furthermore, through the use of the dopant stoichiometric ratio and ratio of molecular radicals, the dopant profile can be further enhanced. Utilization of the pulse biasing of the substrate and possible substrate back surface antenna or substrate movement can also provide the lateral positioning advantages required for selective implantations.

The present invention provides a system that can be independent of the substrate size, and as long as uniformity of plasma is conserved, then multiple pieces of substrate can be implanted simultaneously. This feature allows productivities well in excess of 1000+ wph. Additionally, the present invention provides a non-line-of-sight implantation method, and thus, is able to dope areas that are constricted, such as the textured surfaces of multi-grade silicon that may have hillocks and re-entrant features on the surface. Doping such surfaces is critical as absence of doping may cause metal shunting.

One application of the present invention is to generate a homogeneous implantation for emitter and Back Surface Field (BSF) doping. At this stage, independent control of surface concentration, profile shape and junction depth can play a significant role in meeting the light conversion properties of a solar cell. Such implant capabilities will avoid the formation of a "dead layer" that is prevalent with incumbent diffusion methods. These layers are formed as a result of un-activated excess near-surface dopants that are accumulated as diffusion is used to form the electrical junctions. Profile management achieved with the present invention's ion implantations can avoid such drawbacks.

FIG. 1 illustrates a cross-sectional side view of one embodiment of a homogeneously doped solar cell 100 in accordance with the principles of the present invention. Solar cell 100 comprises a semi-conducting substrate 110, such as a silicon wafer. For the formation of the region 120 where the cell 100 generates the electron-hole pairs, doping levels of at least 100 Ohms/Sq. is preferred. In general, the excess of dopants in this region 102 impede the generation and transport of such charge carriers. This doping is typically a lower energy implant, such as less than 150 keV for boron, $BF_2$, phosphorous, arsenic, antimony, and other similar dopants. Such implants are carried out at a light concentration. In a preferred embodiment, the concentration of these implants is less than $1E15$ $cm^{-2}$. The requirements for the uniformity of coverage for solar cell applications are estimated to be between 5 to 10%. Similar homogeneity is required in the plasma uniformity. It is envisaged that each solar cell will be independently implanted, so as to attain the benefits of the single wafer system. This feature provides significant capability for implant, whereby tailoring the placement and activation of the dopant for selective emitter can prevent the formation of the traditional dead layer issues.

FIGS. 2A-2C illustrate cross-sectional side views of different ways of selectively implanting a solar cell 200 to form selective emitter regions 230 in accordance with the principles of the present invention. The solar cell 200 comprises a semi-conducting substrate 210, which has been homogeneously doped to form a homogeneous emitter region 220, similar to homogeneous emitter region 120 in FIG. 1.

FIG. 2A illustrates a shadow mask method used to form selective emitter regions 230 in the semi-conducting substrate 210. In the shadow mask method, a physical mask 242 is used within the plasma implanter technologies system to define the beam 240 to the exact dimension required. The aspect ratio of the mask 242 is critical here, as it is estimated that typical energetic plasma ions can easily penetrate a 1:10 aspect ratio, as has been demonstrated by lower energy plasma deposition methods. The proximity of the mask 242 to the substrate 210 can be adjusted to use potential beam flare-out to the advantage of construction of doped regions under the gridlines that are larger by approximately +/−10 to 30 microns for a 100 micron wide gridline. This adjustment will allow for ease of subsequent gridline printing and alignment, and will provide an overlapping region for minimization of any potential electrical leakage. In a preferred embodiment, the material used for the shadow mask 242 is innocuous to the processing, and is preferably conductive in order to not affect the implantation method. Sputtering of such material will determine the lifetime and usage of this mask 242, thus rendering it a consumable component with a regular replacement provision. The shape of the cutouts through which the ion beams 240 pass and surface conditions are also of critical considerations to minimize contamination and sputtering rates. Typical shaping that is already prevalent in the industry can be used for the fabrication of the shadow mask 242.

FIG. 2B illustrates a wafer mask method used to form selective emitter regions 230 in the semi-conducting substrate 210. Here, a mask 244 is placed in contact with the semiconducting wafer 210. Such mask 244 can be a hard or soft masking of the wafer prior to the implant step. The wafer mask method can be achieved through the use of lithography, contact printing, or more prevalent screen printing steps. It can also utilize the already masked and opened processing steps used for formation of contact deposition. The distributed power density of this implantation method can lead to utilization of masking materials that were not used in the past implantation methods. An example of such materials is the use of resist that is used, traditionally, in circuit board fabrications and other low temperature masking materials.

FIG. 2C illustrates a localized plasma beam shaping method to form selective emitter regions 230 in the semi-conducting substrate 210. Here, the required pulsing of the beam and an envisaged back surface antenna can be made into a closed loop control so that plasma is directed selectively into certain regions of the substrate. In some embodiments, additional grid structures, such as those discussed in further detail below, could be used to further optimize the shape of the plasma beam, whereby a voltage can be applied, both negative and/or positive, to achieve such shaping. As seen in FIG. 2C, the selected regions 230 are in alignment with the locations where a voltage 246 is directly applied to the back surface of the semiconducting wafer 210. This method may be more applicable for thinner wafers. Alternatively, a combination of the pulsing of the plasma and possible positioning of the substrate can be used to generate areas of high and low doping. Overlapping of these regions can provide an optimized controlled flow of electron holes from the low-doped regions, suited for light conversion, to the highly-doped selectively implanted regions, suited for electrical contact gridlines. One could envisage regions of high and low doping overlaps as the substrate, under precise controlled motions, moves beneath the ion beams. The different regions will not have distinctive boundaries, and a gradual change of doping levels can provide an advantage in flow of charges within the substrate. Such variability in the lateral doping can enhance the operation of the cells.

FIG. 3 illustrates a cross-sectional side view of one embodiment of a solar cell 300 with contact gridlines 350 in accordance with the principles of the present invention. The solar cell 300 comprises a wafer. In some embodiments, the wafer 110 is a 156×156 mm wafer. Preferably, the wafer is formed of a semiconductor material, such as silicon (single or multi-crystalline), and comprises a p-n junction. The p-n junction is formed from a p-type doped region 310 and an n-type doped region 320 being disposed next to one another. Metal contact lines 350 are printed, or otherwise formed, on the surface of the wafer. It is contemplated that the contact lines 350 can also be formed from conductive material other than metal. In some embodiments, conductive fingers (not shown) are also disposed on the surface of the wafer to collect the electrical charge from the contact lines and carry it out to an external load.

In operation, as light comes into the semiconductor material of the wafer through the exposed surface between the contact lines 350, it is converted into electron-hole pairs, typically within the n-type doped region 320. The electrons go one way, getting attracted into the contacts 350, while the holes go the other way, towards the p-type doped region 310. The more dopant there is within a particular region, the more the electron-hole pairs are recaptured within that region, resulting in more lost electricity. Therefore, it is beneficial to control the level of doping for different regions. In regions where the light is to be converted into electron-hole pairs, the level of doping should be relatively low. In regions where the charge is to go through the contact lines 350, the level of doping should be high. Regions 320 represent a homogeneous emitter region that has been homogeneously doped with a low level of n-type dopant. Regions 330 disposed beneath the contact lines 350 near the surface of the wafer represent selective emitter regions that have been selectively doped with a relatively high level of n-type dopant.

As a result of minimizing the dopant concentration (thereby, maximizing the resistivity) of the homogeneous emitter region and maximizing the dopant concentration (thereby, minimizing the resistivity) of the selective emitter regions, the ability of the solar cell to transfer the generated electrons from the homogeneous emitter region through the selective emitter regions to the contact lines is increased, while the risk of losing electricity to electron-hole pair recombination is reduced. Additionally, although bigger contact lines can conduct more electricity, they also block more light from entering the solar cell and being converted into electrons. By maximizing the dopant concentration of the selective emitter regions near the contact lines, the contact lines can actually be made thinner, thereby allowing more light to enter the solar cell, while improving the solar cells ability to transfer the electrons from the electron-hole pair generating region to the contact lines.

In some embodiments, the homogeneously doped region is doped to have a sheet resistance in a range of approximately 80 Ohms/square to approximately 160 Ohms/square, while the selectively doped regions are doped to have a sheet resistance in a range of approximately 10 Ohms/square to approximately 40 Ohms/square. In some embodiments, the homogeneously doped region is doped to have a sheet resistance of approximately 100 Ohms/square or greater, while the selectively doped regions are doped to have a sheet resistance of approximately 25 Ohms/square or less.

In some embodiments, the selectively doped regions 330 are laterally spaced apart from one another a distance in the range of approximately 1 mm to approximately 3 mm. However, it is contemplated that other spacing dimensions are within the scope of the present invention. Additionally, for selective emitter applications, the solar cell industry is expected to require the implanted contact gridlines 350 to have a width from 200 microns down to less than 50 microns.

Plasma implantation systems can be used for the formation and adjustment of the work function and the band gap engineering for the contact deposition, through the formation of near-surface metal-silicide. Through a very light dose implantation of a metallic species (such as Ta, Ti, etc.) at locations near the surface of the wafer, a metal/silicon contact is improved markedly. Such seed implants or work function adjustment implants can improve contact performance.

Figure 4:
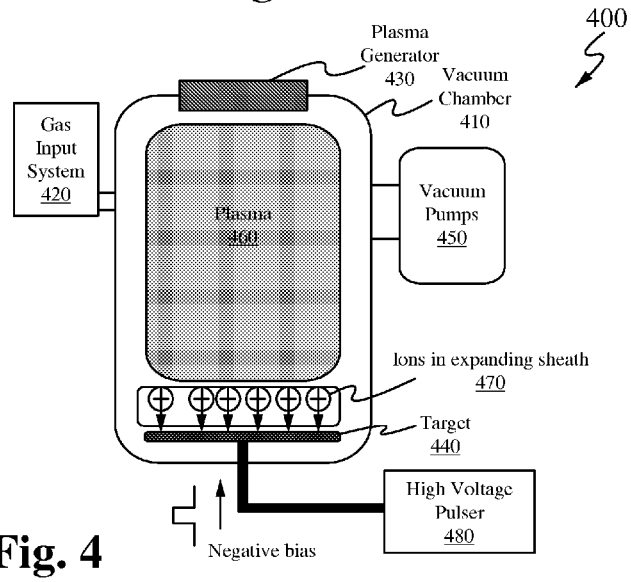
FIG. 4 illustrates one embodiment of a plasma immersion implantation system in accordance with the principles of the present invention.

FIG. 4 illustrates one embodiment of a plasma immersion implantation system 400 in accordance with the principles of the present invention. This system is disclosed in U.S. Provisional Application Ser. No. 61/185,596, filed Jun. 10, 2009, entitled "APPLICATION SPECIFIC PLASMA IMPLANT SYSTEM FOR USE IN SOLAR CELL FABRICATIONS," which is hereby incorporated by reference in its entirety as if set forth herein. The system 400 comprises a vacuum chamber 410, a gas input system 420, a plasma generator 430, one or more vacuum pumps 450, and a high-voltage pulser 480. The gas input system 420, the plasma generator 430, and the vacuum pumps 450 work together to provide plasma 460 within the vacuum chamber 460 at a location near a target substrate 440. The high-voltage pulser 480 is used to negatively bias the target substrate 440. Examples of pulsers that can be used include hard-tubed pulsers, such as planar triode, power tetrode, and hobertron. It is contemplated that other pulsers can be used as well. As a result of the high negative voltage pulse being applied to the target substrate 440, a sheath between the plasma 460 and the target substrate 440 forms, and ions 470 from the plasma 460 are accelerated into the target substrate 440. This plasma immersion implantation technique removes the need for any mass analysis. It provides acceptable power density and excellent productivity.

This implantation system has unique capabilities for solar cell applications. In order to meet the productivity demand of the solar cell industry, multiple-piece simultaneous implantation is envisaged. For a typical four-piece substrate of 156× 156 mm pseudo-square, with a total area of 0.25 m$^2$, such a system will preferably comprises a large plasma, with a height of 0.3 m and a sheath of 0.5 cm, and a total chamber height of 1 m, with generation of plasma peak currents up to 15 A. The system is useful in meeting the pulse energy demands of the solar field, which are variable and preferably less than 150 kV. These supplies will be plug compatible and, depending on the species and mass used, will provide the required depth of penetration.

In some embodiments, the system is used for single species implantation, so as to avoid any cross contamination of dopants. Additionally, in some embodiments, the internal portion of the chamber 410 is clad with appropriate material so as to minimize the potential of metallic and other unwanted contamination.

Preferably, components such as the vacuum chamber, multiple-pass load lock, gas delivery system, and automation and factory interfaces are configured in-line with such an application specific system or in-line with a typical high volume solar cell manufacturing system. In preferred embodiments, the system operates with a productivity of 1000+ wafers per hour to match the automation of the solar cell fabrication lines.

The dopant profile can be modified through the pulse shape adjustment to meet the tailoring required by solar cell PV fabrications. One method is to use a passivation pulse-forming network mechanism. The profile can further be tailored by the use of plasma content adjustment, which can be achieved through the special use of micro-wave or RF coupling, or any multiple of prevalent plasma formation technology, with plasma so as to modify the plasma conditions and thus control the break up of the constituents, which can affect the stoichiometric ratio of the dopant and the molecular ratio of radicals present in the plasma. For example, for the use of solid phosphorous, its various components (such as $P^+$, $P^{++}$, $P^{+++}$, $P_2^+$, $P_3^+$, $P_5^+$, etc.) can be used to ensure that near surface tailoring is achieved. Such tailoring can also be used for other dopants, such as p-type Boron.

A direct side benefit of plasma implant technology is the prevalence of hydrogen (e.g., if the source of the dopant is $PH_3$ or $B_2H_6$). The hydrogen will be implanted simultaneously and at higher energies, helping to provide an auto-gettering effect that is unique and demanded for poorer quality solar cell materials.

Variability of the energy during the pulsing of the plasma, where it can be distinct or as a continuum, can also be employed to form the required profile and manage independent surface concentration, atomic profile shaping and junction depths. This could be distinct and in known steps or can be as continuum to appropriate pauses at required energy to contrast the desired profiles.

The average distributed power density of this system lends itself to implantation of very thin wafers (i.e., less than 20 microns) and ensures that thicker wafers remain at a temperature of less than 100° C. throughout the process. Such distributed power density allows utilization of various hard masking (e.g., resist) materials that may not have been considered before with diffusion, which employs high temperature, and directed implant, which employs high average power density. Depending on the desired PV applications, the average distributed power density of the present invention can be modulated by adjusting the frequency and duration of pulses for high (greater than 300° C.) and low (less than 100° C.) substrate temperature.

No subsequent diffusion is required. Lower temperature anneal as low as 500° C. can provide enough activation and damage anneal for fabrication of a PV cell. Plasma implantation, due to its high productivity, can provide higher doses, and thus, if only a portion of the dopant is activated, then the desired resistivity and performance can be achieved.

In some embodiments, various materials or compounds are used to provide surface passivation in solar cell fabrication. For example, in some embodiments, $Si_3N_4$ or $SiO_2$ is deposited and/or grown at elevated temperatures or using pyrogenic growth methods. Such methods are limited to prevalent chemistry and molecular make up cannot be changed. However, through the use of the plasma implant technology of the present invention, the molecular make-up can be adjusted for improvements of passivation properties. Formation of $SiN_x$ or introduction of excess nitrogen can provide improvement of passivation properties of this film.

Despite the advantages of the plasma immersion implantation system discussed above, the present invention provides an even more beneficial implantation system in the form of a plasma grid implantation system. The plasma grid implantation system provides the beneficial power density of beamline implantation, while also providing the productivity of plasma immersion technology.

Figure 7:
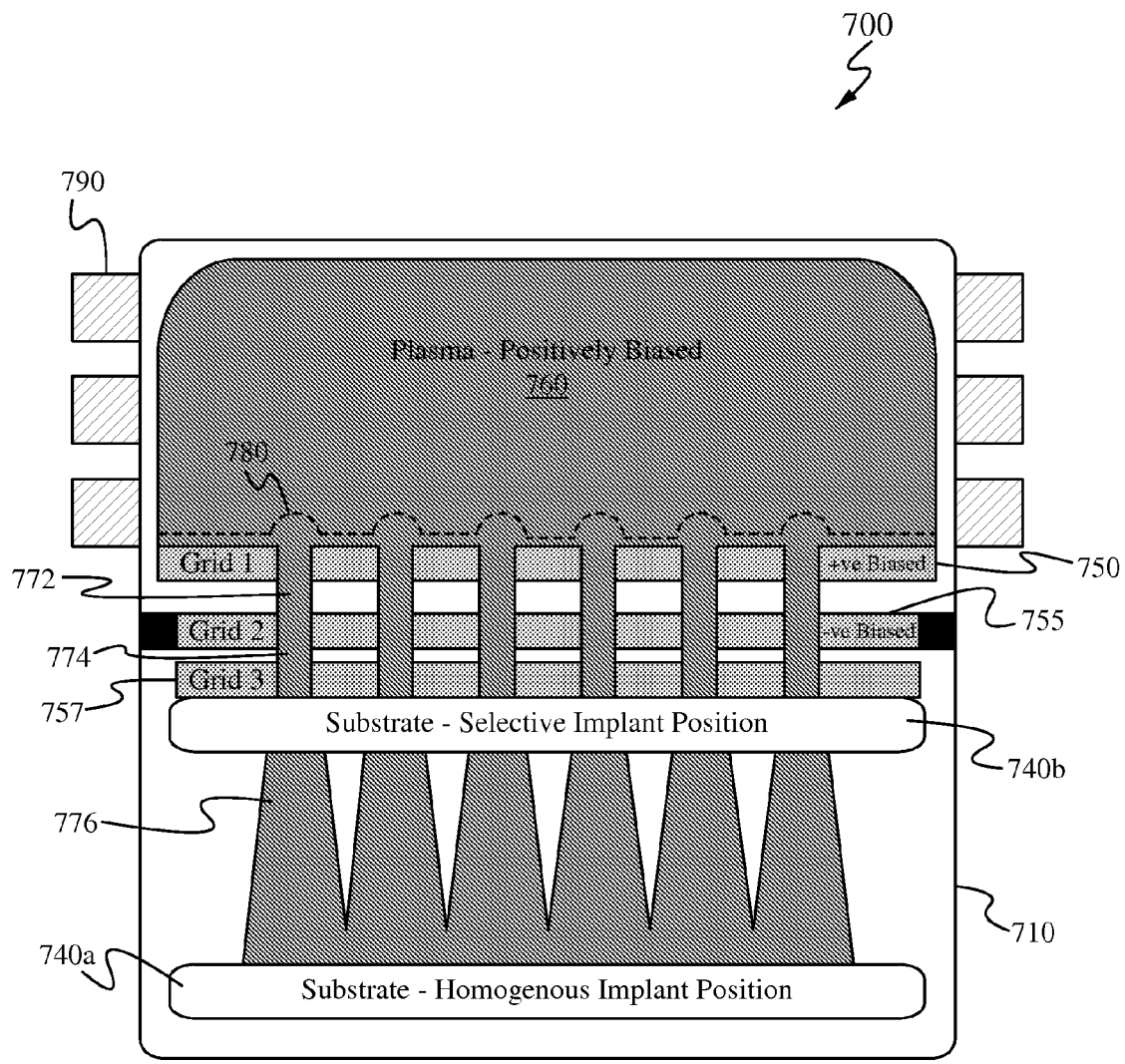
FIG. 7 illustrates a cross-sectional side view of one embodiment of a plasma grid implant system in accordance with the principles of the present invention.

FIG. 7 illustrates a cross-sectional side view of one embodiment of a plasma grid implant system 700 in accordance with the principles of the present invention. System 700 comprises a chamber 710 that houses a first grid plate 750, a second grid plate 755, and a third grid plate 757. The grid plates can be formed from a variety of different materials, including, but not limited to, graphite, silicon carbide, and tungsten. Each grid plate comprises a plurality of apertures configured to allow ions to pass therethrough. A plasma source provides a plasma to a plasma region of the chamber 710. In FIG. 7, this plasma region is located above the first grid plate 750. In some embodiments, the chamber walls are configured to repel ions in the plasma region using an electric field. For example, in some embodiments, one or more magnets 790 are coupled to the wall of the chamber 710. The electric field is used to push the plasma off the walls, thereby maintaining a gap between the plasma and the chamber walls, and avoiding any sputtering off of the wall material into the plasma. A target substrate is positioned on the opposite side of the grid plates. In FIG. 7, the target substrate is located below the third grid plate 757. As will be discussed in further detail below, the target substrate is preferably supported by an adjustable substrate holder, thereby allowing the target substrate to be adjusted between a homogeneous implant position 740a and a selective implant position 740b.

The main feature of this system 700 is the use of plasma ions that are accelerated towards the target substrate by application of a DC or pulsed potential to the first grid plate 750. These ions are implanted into the substrate. The deleterious effect of secondary electrons resulting from the impingement of ions on the substrate and other materials is avoided through the use of the second grid plate 755, which is negatively-biased with respect to the first grid plate 750. This negatively-biased second grid plate 755 suppresses the electrons that come off of the substrate. In some embodiments, the first grid plate 750 is biased to 80 kV and the second grid plate 755 is biased to –2 kV. However, it is contemplated that other biasing voltages can be employed. The third grid plate 757 acts as a beam defining grid and is preferably grounded. It is positioned in contact with or very close to the surface of the substrate in order to provide a final definition of the implant. This grid plate 757 can act as a beam defining mask and provide the critical alignment required, if a selective implant is required. The third grid plate 757 can be configured in accordance with the shadow mask embodiment of FIG. 2A or the wafer mask embodiment of FIG. 2B in order to achieve beam-defining selective implantation. Additionally, The third grid plate 757 can be replaced or supplemented with any form of beam shaping that does not require a mask, such as the pulsed beam shaping embodiment of FIG. 2C.

It is contemplated that the grid plates can be spaced apart in a variety of ways. In one embodiment, the first grid plate 750 is separated from the second grid plate 755 by a distance of approximately 12 mm, and the second grid plate 755 is separated from the third grid plate by a distance of approximately 3 mm. However, other measurements can be employed.

In general, several grid arrangements, such as triode, tetrode and others, can be envisaged, where the grid arrangements are used to optically control the ion beam-lets. For the case of homogenous implantation, the defining mask can be removed to provide homogenous coverage of the wafer. The position of the wafer for selective implantation, with shadow mask, and for homogenous implantation can be altered to benefit from the multiple grids beam definition. For example, for the selective implantation, the wafer 740b is moved close to the multiple grid plate assembly (750, 755, 757), whereas, for the homogenous implantation, the wafer 740a is moved far enough from the grid plate assembly (750, 755, 757) to provide a uniform beam, which is formed as a result of space charge expansion of the beam-lets 776. This grid plate assembly can be used to further focus the beam-lets 776 into known shapes onto the substrate, such as by adjusting the position of the plates with respect to one another, thereby eliminating the need for any shadow masking or any other substrate masks. This grid plate assembly arrangement enables the use of DC or pulsed bias for the acceleration of ions and minimizes the back streaming electrons that has hampered plasma immersion technology by limiting the energy range and making the pulser/PSU cost prohibitive. This dramatically simplifies the power supply needed.

Additionally, by decoupling the plasma formation from the ion acceleration, the present invention allows for independent methods to be used for the formation of the plasma above the grid plates. The grid plates can provide some degree of beam definition. For example, the extracted ion beam can be focused to a particular dimension of selective emitter applications.

In plasma grid implant system 700, the chamber 710 is configured to allow the plasma to form and expand. As previously discussed, the first grid plate 750 is at a positive potential with respect to ground. By shaping this biased grid plate (electrode) and managing the shape of the meniscus 780 formed above each of its openings, ions are extracted and optically shaped.

As previously discussed, the second grid plate 755, which is negatively biased, suppresses the back streaming electrons. The substrate and the third grid plate 757 (whether it is configured as a shadow mask or a wafer mask) can be placed at a very close proximity to the second grid plate 755 to utilize the pattern definition by the grid assembly, as shown with the position of substrate 740b. At this position, the ions extracted are in the shape of beam-lets that are well defined and implanted in selective regions in the substrate 740b. The substrate can also be positioned further away from the first and second grid plates 750 and 755 to achieve a homogenous and uniform implant either with or without the use of a shadow mask, such as with substrate 740a. As seen with the positioning of substrate 740a, the beam-lets 776 have merged due to space charge expansion. Alternatively, one position could be used for both homogeneous and selective implantation, where the selective implant is performed in the presence of a shadow mask or a wafer mask in order to provide the selectivity required.

A beam of ions exiting past an aperture is divergent by its nature, which is because the typical equilibrium of plasma is convex. The ions repel each other because of their like electric charge and they have randomly orientated velocities due to thermal motion within the plasma. Therefore, careful design of the grid plate apertures and the plasma condition is necessary to control both the emittance of ions and system acceptance to the ion beam. The emittance is a measure of the beam quality. Typically, high quality beams have low emittance, which means minimal loss of ions during transmission. This has to be balanced against the system specific phase-space boundary such that the beam fits within this boundary or has good acceptance.

The control of ion divergence in the system of the present invention is achieved primarily through adjusting the shape of the ensuing meniscus 780 at the plasma boundary as it enters the first grid plate electrode 750. Such shaping can be controlled by adjusting the voltage difference between various electrodes, the shapes of the opening and spacing between various electrodes, the temperature of the plasma, how much plasma gas is used, the density of the plasma and the ion species and current being extracted. For the concave dome shape of meniscus 780 in FIG. 7, the second grid plate 755 has to have a negative potential with respect to the first grid plate 750, and the plasma ion density has to be less than the plasma boundary. Although FIG. 7 shows meniscus 780 having the shape of a dome, it is contemplated that the meniscus 780 can be managed in the form of other shapes as well, including, but not limited to, a complete inversion of the dome shape. The shape of the meniscus 780 can be used to shape the resulting ion implantation beam. Whereas a dome-shaped meniscus, such as meniscus 780 shown in FIG. 7, will typically result in a narrowed beam, an inverted dome-shaped meniscus will typically result in an expanding beam.

Figure 8:
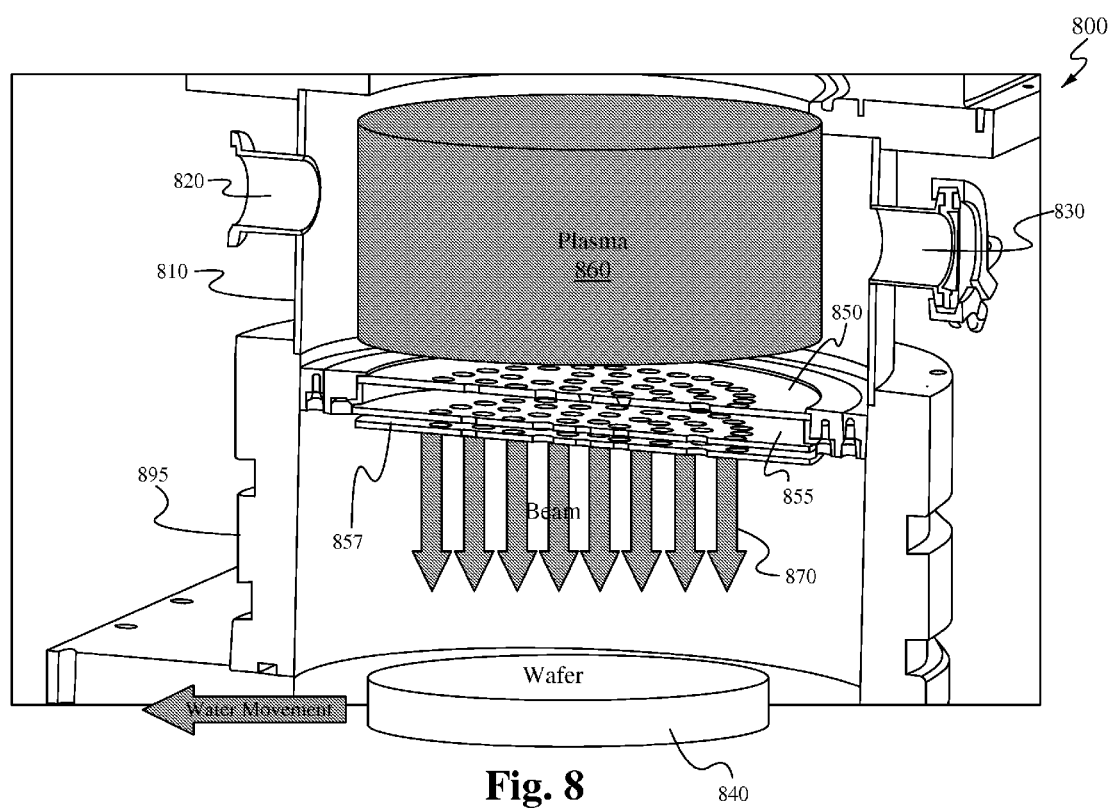
FIG. 8 illustrates a cross-sectional 3-dimensional perspective view of another embodiment of a plasma grid implant system in accordance with the principles of the present invention.

FIG. 8 illustrates a cross-sectional 3-dimensional perspective view of another embodiment of a plasma grid implant system 800, similar to system 700, in accordance with the principles of the present invention. System 800 comprises a chamber 810 that houses a first grid plate 850, a second grid plate 855, and a third grid plate 857. The grid plates can be formed from a variety of different materials, including, but not limited to, silicon, graphite, silicon carbide, and tungsten. Each grid plate comprises a plurality of apertures configured to allow ions to pass therethrough. A plasma source provides a plasma to a plasma region of the chamber 810. In FIG. 8, this plasma region is located above the first grid plate 850. In some embodiments, a plasma gas is fed into the plasma region through a gas inlet 820. In some embodiments, a vacuum is applied to the interior of the chamber 810 through a vacuum port 830. In some embodiments, an insulator 895 is disposed around the exterior wall of the chamber 810. In some embodiments, the chamber walls are configured to repel ions in the plasma region using an electric field, as discussed above.

A target wafer 840 is positioned on the opposite side of the grid plates from the plasma region. In FIG. 8, the target wafer 840 is located below the third grid plate 857. As previously discussed, in some embodiments, the target wafer 840 is supported by an adjustable substrate holder, thereby allowing the target wafer 840 to be adjusted between a homogeneous implant position (closer to the grid plates) and a selective implant position (farther away from the grid plates). Plasma ions are accelerated towards the target wafer 840 by application of a DC or pulsed potential to the first grid plate 850 in the form of ion beams 870. These ions are implanted into the wafer 840. The deleterious effect of secondary electrons resulting from the impingement of ions on the wafer 840 and other materials is avoided through the use of the second grid plate 855, which is negatively-biased with respect to the initial grid. This negatively-biased second grid plate 855 suppresses the electrons that come off of the wafer 840. In some embodiments, the first grid plate 850 is biased to 80 kV and the second grid plate 855 is biased to −2 kV. However, it is contemplated that other biasing voltages can be employed. The third grid plate 857 acts as a beam defining grid and is preferably grounded. It is positioned in contact with or very close to the surface of the substrate in order to provide a final definition of the implant. This grid plate 857 can act as a beam defining mask and provide the critical alignment required, if a selective implant is required. The third grid plate 857 can be configured in accordance with the shadow mask embodiment of FIG. 2A or the wafer mask embodiment of FIG. 2B in order to achieve beam-defining selective implantation. Additionally, The third grid plate 857 can be replaced or supplemented with any form of beam shaping that does not require a mask, such as the pulsed beam shaping embodiment of FIG. 2C.

It is contemplated that the apertures in the grid plates can be configured in a variety of different ways. FIGS. 9A-9B illustrate cross-sectional side views of different grid plate apertures through which the ion beams pass. In FIG. 9A, grid plate 950a comprises an aperture 965a that has a uniform width. When the grid plate 950a is positively-biased, an electric field is formed around it. This electric field is illustrated by electric field lines 951a and 953a, which follow the contour of the grid plate 950a. As an ion beam passes through the aperture 965a, field lines 951a and 953a define the path along which the ions travel. As a result, the electric field chokes the ions as they pass through the aperture 965a, thereby narrowing the width of the resulting ion beam. In FIG. 9B, grid plate 950b comprises an aperture 965b that has a width that expands from top to bottom. Similar to grid plate 950a in FIG. 9A, when the grid plate 950b is positively-biased, an electric field is formed around it. This electric field is illustrated by electric field lines 951b and 953b, which follow the contour of the grid plate 950b. As an ion beam passes through the aperture 965b, field lines 951b and 953b define the path along which the ions travel. Since the width of the opening 965b expands as from the point where the ions enter the aperture 965b to the point where the ions exit the aperture 965b, this aperture configuration provides a resulting ion beam that can cover a larger surface area than the uniform configuration.

FIG. 10 illustrates a cross-sectional side view of one embodiment of plasma ions passing through grid plates in accordance with the principles of the present invention. Similar to FIGS. 7-8, a plasma 1060 is provided above first and second grid plates 1050 and 155, which are positively and negatively biased, respectively, as previously discussed. A meniscus 1080 is formed at the plasma boundary as the plasma ions enter aperture of the first grid plate electrode 1050. The ion beam 1070 passes through the first grid plate electrode 1050 and then through the second grid plate electrode 1055 before implanting a target substrate disposed below the grid plate assembly. The top and bottom surfaces of the grid plates can be configured to manage the ion beam 1070 in a variety of ways. For example, in some embodiments, the bottom surface 1052 of the first grid plate 105 can be angled inward in a female configuration and the top surface 1054 of the second grid plate 1055 can be angled outward in a male configuration so that the entrance to the aperture in the second grid plate 1055 can be brought closer to the exit of the aperture in the first grid plate 1050.

FIGS. 11A-11B illustrate plan views of different grid plate apertures in accordance with the principles of the present invention. FIG. 11A shows grid plate 1050a having a plurality of apertures 1165a formed therethrough. These apertures 1165a are substantially circular. FIG. 11B shows grid plate 1050b having a plurality of apertures 1165b formed therethrough. These apertures 1165b are substantially elongated and rectangular slots. In some embodiments, the elongated slots 1165b have dimensions of a few 100's of microns wide by 10's of centimeters long at a spacing of 1-2 mm in order to maximize the utilization of the plasma beam-lets and create the image of the final beam-defining grid. However, larger spacing could be envisaged, whereby the space charge beam expansion is employed to get a uniform beam to provide the coverage needed. It is contemplated that the apertures can be formed in other shapes besides circular and rectangular. The shape and the dimensions of the openings in the grid plates depend on the shape and dimension of the series of beam-lets required for the particular implantation. Beam optics calculations and considerations, such as emittance and space charge effects, define the shape of such openings and the materials utilized for the fabrication. The opening in the first grid plate is particularly critical in order to maintain the shape of the resulting meniscus of plasma at the grid plate openings. The shape of this meniscus is critical for the subsequent optical properties of the ion beam. The position, shape, and applied negative potential field at the second grid plate and its possibility of interference in the shape of the meniscus is critical to ensure passage of the ion beam with minimum ion optical effect, while still being sufficient to inhibit flow of electrons in the reverse direction.

The combination of the two, three or more grid plates simplifies the DC or plused power supply units for energizing the grid plates. For these applications, an accelerating potential of less than 150 kV is envisaged, with a negatively biased grid plate of approximately −5 kV. The grid plate spacing between the first grid plate and the second grid plate in a reasonable vacuum is preferably in the order of a few centimeters, while the spacing between the second grid plate and the third grid plate is preferably in the order of a few millimeters. Certain calculations and distances in vacuum can be used for the applied voltage.

The second grid plate electrode can also be connected to a pulse forming network to optimize the extracted ion qualities, such as increased density of desired ion species and ion energy, in order to optimize the implanted junction profile. The plasma source in the chamber can also be pulsed-biased using the similar pulse-forming network in modulation with that of the second grid plate electrode in order to optimize the extracted ion qualities as mentioned in above.

Figure 12:
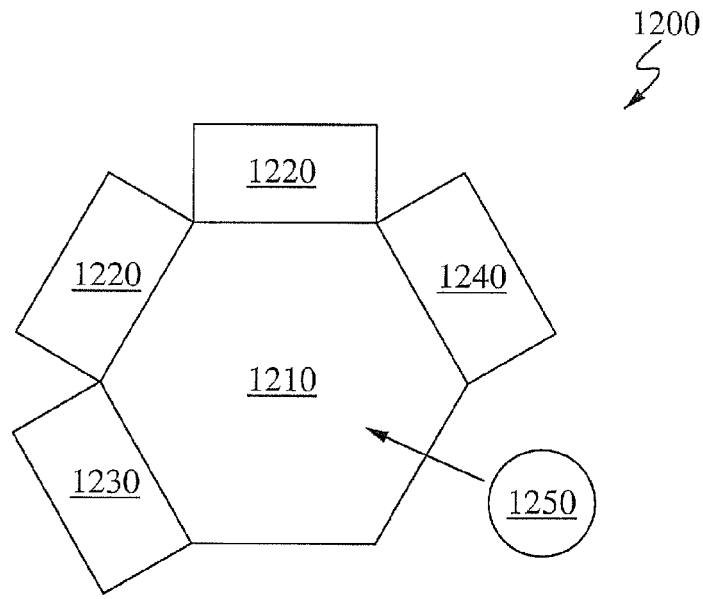
FIG. 12 illustrates a plan view of one embodiment of a load-locked implantation system in accordance with the principles of the present invention.

The system of the present invention provides a simplified arrangement that lends itself well into formation of implant chambers, as opposed to single beam (including widened beams) and scanning mechanisms that have made ion implantation systems into complex multi-module systems. Such simple ion beam generation (via plasma) and ion acceleration (via grid plate assembly) can be constructed into a single chamber assembly that can be combined with a general wafer handling platform. Such a platform can support other processes in the fabrication lines, such as vacuum deposition, etching and metallization. FIG. 12 illustrates a plan view of one embodiment of a load-locked implantation system 1200 in accordance with the principles of the present invention. The target wafer can be loaded into a vacuum chamber 1210, where a robot can then transfer the wafer to one of several load-locked chambers under vacuum. For example, the wafer can be moved into one of several implantation systems 1220, such as system 700. The wafer can also be moved into a nitridization chamber 1230 or an oxidation and anneal chamber 1240, such as an RTP anneal chamber.

Figure 13:
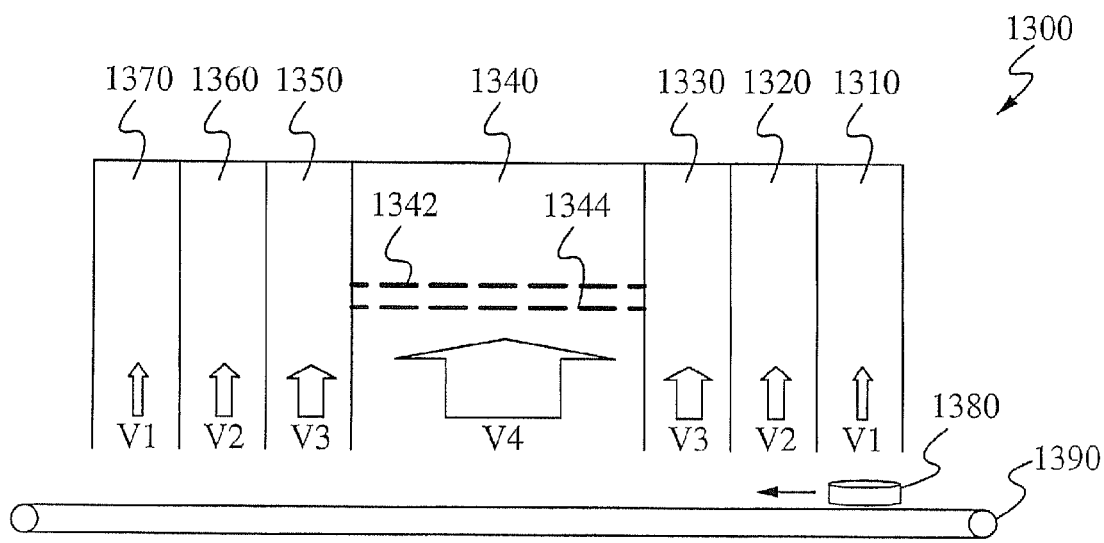
FIG. 13 illustrates a cross-sectional view of one embodiment of a multi-stage differentially pumped implantation system in accordance with the principles of the present invention.

Furthermore, such a platform can support a multi-stage vacuum pumping scheme that denies the need for specific load-locking mechanisms. FIG. 13 illustrates a cross-sectional view of one embodiment of a multi-stage differentially pumped implantation system 1300 in accordance with the principles of the present invention. In the system, the target wafer 1380 is moved through multiple stages before and after reaching the implantation stage. In some embodiments, the wafer 1380 is moved via a conveyor belt 1390. However, it is contemplated that other transfer means can be employed. In FIG. 13, the wafer 1380 moves from right to left, going through stage 1310, then stage 1320, and then stage 1330, before reaching stage 1340, with each stage applying a stronger vacuum. Stage 1310 applies a small vacuum V1 (e.g., resulting in a pressure of 0.1 millibars). Stage 1320 applies a larger vacuum V2 than stage 1310 (e.g., resulting in a pressure of 0.01 millibars). Stage 1330 applies an even larger vacuum V3 than stage 1320 (e.g., resulting in a pressure of $10^{-4}$ millibars). Finally, Stage 1340 applies the largest vacuum V4. At stage 1340, the plasma grid implantation system discussed above is used, employing the multiple grid plate assembly (e.g., grid plates 1342 and 1344). Once the implantation stage is completed, the wafer 1380 moves through stage 1350, then stage 1360, and finally stage 1370, each stage applying a smaller vacuum than the last stage.

The vacuum chamber, multiple pass load lock or multi-staged differentially-pumped pass-through, gas delivery system and automation and factory interfaces can also be configured in-line with an application specific implantation system or configure in-line with a typical high volume solar cell manufacturing system. Preferably, the productivity of the system is 1000+ wafers per hour to match the automation of the solar cell fabrication lines.

For homogenous implantation for emitter and back surface field (BSF) doping, independent control of surface concentration, profile shape and junction depth can play a significant role in meeting the light conversion properties of a solar cell. Such implant capabilities will avoid the formation of "dead layer" for emitter, which is prevalent with incumbent diffusion methods. These layers are formed as a result of unactivated excess near surface dopants accumulated as diffusion is used to form the electrical junctions. Profile management achieved with ion implantation can avoid such drawbacks. The BSF implant can be used to displace the present method of aluminum metallization that is encumbered with a series of mismatch issues. The control for such BSF implantation will also provide key advantages in the formation of back contact.

For the formation of the regions where cells generate the electron hole pairs, doping levels of at least 100 Ohms/Sq. is preferably used. In general, the excess of dopants in this region impedes the generation and transport of such charge carriers. This region is typically a lower energy implant, such as less than 150 keV for boron, BF2, phosphorous, arsenic, antimony, and other similar n or p-type dopants. Such implants are carried out at a dose of less than $1E16 cm^{-2}$. The requirements for the uniformity of coverage for solar cell applications are estimated to be between 5 to 10%. This requires similar homogeneity in the plasma uniformity. It is envisaged that each solar cell will be independently implanted, so as to attain the benefits of the single wafer system, which is a significant capability for implantation, whereby tailoring the placement and activation of the dopant for the selective emitter regions can avoid the formation of the traditional dead layer issues. As implantation is a single sided process, there will be no necessity for the edge etch or cutting of the solar cells.

This capability is achieved by positioning the target substrate underneath the grid assembly electrodes only at a distance far enough where the beam-lets have converged due to space charge expansion to a uniform beam. This positioning can be achieved through the use of an elevator that moves the target substrate to and away from the grid assembly. The plasma intensity variation and variation of the potential on the second grid plate and, at times, on the first grid plate also provide the uniformity of less than 5% (one sigma) in the beam.

As mentioned above, another application of the present invention is to use some form of masking to generate selectively implanted regions. Such regions can be n or p-type depending on whether it is for a selective emitter or a selective BSF. It can also be a series of interdigitated alternate doping (n/p/n/p ... etc) regions for all back contact solar cells. For this application, the target substrate plus the mask could be held very close to the grid assembly, where the beam-lets are much more distinct and spaced apart. Alternatively, one could rely on the shadow mask at the wafer to provide the implant selectivity required. The dimensions of the grid plate openings can match the substrate mask for best utilization of the ion beam. Although, this is not critical as presence of the mask on the wafer will ensure selectivity.

In another embodiment, the plasma grid implant system of the present invention is used for the formation and adjustment of the work function and the band gap engineering for the metal/semiconductor contact regions. In this step, through metallic species implantation at locations very near the surface, metal/silicon contact is improved markedly. A similar system, as discussed above, can be used to do the grid line implants after the selective doping implants. Such seed implants or work-function-adjust implants can improve contact performance.

The control of the dopant atomic profile can also be made through the prevalence of multiple species available in a plasma. Each plasma condition will have a mix of charged species at varying fractions. Such fractions can be controlled and are repeatable. Such mixed species is of the desired atoms at molecular and multiple charge state and, for the same applied voltage bias, will have varying energies. For example, a single type of dopant material can be provided to a plasma generator, where it is broken up into a plurality of dopant species. The target substrate is then implanted with the plurality of dopant species. For example, using a plasma gas such as phosphine, can provide different types of implants with only one implantation step because of the different charges and different masses of the resulting dopant species ($P^+$, $P^{++}$, $P^{+++}$, $P_2^+$, $P_3^+$, $P_5^+$, etc.) that are formed from the phosphine being broken up. The amount of each dopant species (i.e., its percentage relative to the total ion beam) can be adjusted by adjusting the conditions of the plasma, such as the power used. In this respect, a user can manage the break-up of the dopant and can tailor it as desired (e.g., 80% $P^+$, 10% $P^{++}$, 5% $P^{+++}$, 3% $P_2^+$, etc.). Each species is implanted depth because their energies are different. This feature can be used for formation of multiple atomic profiles that net into the desired shape ideal for the fabrication.

The use of the grid plates of the present invention with limited openings between the chamber region that contains the plasma and the chamber region that contains the substrate ensures effective differentially-pumped regions. In the plasma region, vacuum has to be controlled in order to allow for the formation of the plasma and minimize any other unwanted species presence. However, a differentially-pumped substrate chamber is also critical because the vacuum can be somewhat variable due to the impact of the substrate surface out-gassing and the load-locking burst of gas. This grid assembly also provides protection against free radicals and other potential airborne hydrocarbons that can affect the surface of the substrate adversely.

The formation of the beam-lets and their subsequent expansion, as a result of natural space charge beam expansion, can be utilized to provide lateral selective region implantation or homogenous implantation. As previously discussed, for the selective implant, the target substrate and a defining grid or a shadow mask can be positioned very close to the third grid plate or in a similar position as for the homogenous implant. The minimum distance for the substrate's proximity to the grid is determined by the voltage holding and applied potential to the grid assembly. The role of the beam-defining shadow mask is to ensure fidelity in the positioning of the implanted region. This mask can be used for improving the alignment of the mask to the substrate, and thus, ensures a higher degree of overlap between selective implanted regions and the subsequent metal grid lines that are screen or jet ink printed on the solar cell.

Such conformal doping of substrate can be utilized to form both homogenous and selective emitter regions through use of a mask and other unique selective doping techniques. At the same time, the dopant profile can be tailored to provide independent surface concentration, shape of the profile and the junction depth, through DC voltage, exposure time, and substrate motion underneath the beam and plasma components adjustments. Further more, by the use of the dopant stoichiometric ratio and ratio of molecular radicals present in the plasma, the dopant profile can be further enhanced. This method does not preclude the utilization of the pulsing of the substrate and possible substrate back surface antenna or substrate movement to provide the lateral positioning advantages required for selective implantations.

The system of the present invention can be configured independently of the substrate size. Furthermore, as long as uniformity of plasma is conserved, multiple pieces of substrate can be implanted simultaneously, thereby allowing productivity well in excess of 1000+ wph.

Additionally, the present invention can provide a non-line-of-sight implantation method, and thus, is able to dope areas that are constricted, such as the textured surfaces of multigrade metallurgical silicon that may have hillocks and re-entrant features on the surface. Doping such areas is critical, as absence of doping may cause metal shunting. Pulsing of the target substrate can be employed to direct the ions these constricted areas.

The implantation system of the present invention provides unique capabilities for solar cell applications. In order to meet the productivity demand of the solar cell industry, multiple-piece simultaneous homogenous implantation can be employed, followed by a masked and selective implantation. However, such implantations can be in any order. For a typical four piece substrate of 156×156 mm pseudo-square, with a total area of 0.25 m$^2$, such a system preferably comprises a chamber with a dimension of 0.4 m in height by 1.2 m in width. This allows for plasma and grid overflow regions to ensure uniformity of implantation on the substrate. Such a system can be used in conjunction with a multi-stage differentially-pumped non-load locked arrangement, as previously discussed, whereby the substrate can be transported on a conveyor or other transport mechanism from an atmospheric side to a vacuum side, and visa versa, which simplifies the whole system and reduces the material cost.

The system of the present invention is expected to generate average ion current density of at least 0.5 mA/cm$^2$ at 90 kV of high voltage bias, which is derived from the following equation:

$$I_p = \frac{D \cdot Ze(1 + \gamma_{SE})A}{f \Delta t \cdot T} \times a \times b$$

where, assuming a typical plasma system:
D=dose [cm-2]
f=pulse frequency [s]
$\Delta t$=pulse duration [μs]
$I_p$=peak current [A]
T=implantation time [s]
Z=charge state
e=electron charge [A-s]
$\gamma SE$=secondary electron emission coeff.
A=surface area [cm$^{-2}$]
a=stoichiometric ratio of dopant
b=molecular ratio of radical in plasma One example provides a gas of $PH_3$, a dose of E16 cm$^{-2}$, a stoichiometric ratio of dopant of 0.25, and a molecular ratio of radical in plasma of 0.3.

The system of the present invention can be used for multiple species, so as to avoid any cross contamination of dopants. Additionally, in some embodiments, the internal walls of the chamber is clad with appropriate material so as to minimize the potential of metallic contamination, and other unwanted contamination, and ease of cleaning, servicing and replacement. Furthermore, as previously discussed, a confining field, such as an electric field, can be added to the internal chamber walls in order to limit the interactions of the plasma or the ions from the surrounding materials. In some embodiments, the ion beam can be skewed and a unique field can be applied so as to only allow the passage of the required species to the target substrate.

The profile of the solar cell can further be tailored by the present invention's use of plasma content adjustment, which can be achieved through the special use of micro-wave or RF coupling with plasma so as to modify the plasma intensity and temperature, and thus control the break-up of the constituents, as previously discussed. This adjustment can affect stoichiometric ratio of dopant and the molecular ratio of radicals present in the plasma. For example, for the use of solid phosphorus, its various components such as $P^+$, $P^{++}$, $P^{+++}$, $P_2^+$, $P_3^+$, $P_5^+$, etc. can be used to ensure that near surface tailoring is achieved. This adjustment can be used for other dopants as well, such as n-type boron.

Another benefit of the plasma implant technology of the present invention is the prevalence of hydrogen, if an appropriate source of the dopant is used, such as $PH_3$ or $B_2H_6$. The hydrogen will simultaneously implanted with the other dopant, and at higher energies, which will help provide auto-gettering and surface passivation effects that are unique and useful for poorer quality solar cell materials.

A variable energy accelerating the plasma, either in distinct steps or as a continuum, can also be employed to form the required profile and manage to generate an independent surface concentration, atomic profile shaping and junction depths. This could be distinct and in known steps, or can be as continuum to appropriate pauses at required energy to contrast the desired profiles.

The average distributed power density provided by the present invention lends itself to implantation of very thin wafers (e.g., less than 20 microns) whether they are independent or mounted on other substrates, and ensures that thicker wafers remain at a temperature of less than 100° C. throughout the process. The distributed power density also enables the processing of non-silicon-based substrates such as CdTe, CIGS, and a-Si thin-film substrate, which require low substrate temperature operation. Wafer cooling and heating may be necessary, in particular as the wafer thickness is reduced, which can be provided in the form of typical backside water cooling or gas cooling or other similar methods.

Such distributed power density allows utilization of various hard masking (e.g., resist) materials that may not have been considered before with diffusion (high temperature) and directed implant (high instantaneous power density).

Another advantage of the present invention is that no subsequent diffusion is required, and thus, lower temperature anneal as low as 500° C. can provide enough activation and damage anneal that can be used for fabrication of a PV cell. Plasma grid implantation, due to its high productivity, can provide higher doses. Therefore, if only a portion of the dopant is activated, the desired resistivity and performance can still be achieved. Auto-annealing also may be employed, where the power of the beam is used to heat the substrate to such a desired temperature so that self-annealing can take place. Furthermore, balancing the elevated temperature of the substrate, masks, and grid assembly can be of major benefit in the general operation, control and metrology of the system.

Utilizing the high productivity of the unique plasma grid implant system, an integrated module of SiNx deposition in conjuction with junction-doping applications can be also achieved without breaking the vacuum. The plasma grid implantation system of the present invention can be used to achieve surface passivation. The difference between implantation and deposition is the energy of the ions. The lower the energy, the more the ions stay on the surface. The present invention enables the formation of a passivation layer, such as a nitride film, on the surface of the wafer through the use of a very low energy implant. The technique currently used is a chemical process. The present invention allows for the application of a passivation layer simply by bleeding a passivation gas, such as silicon or nitrogen, into the plasma region of the chamber.

Figure 14:
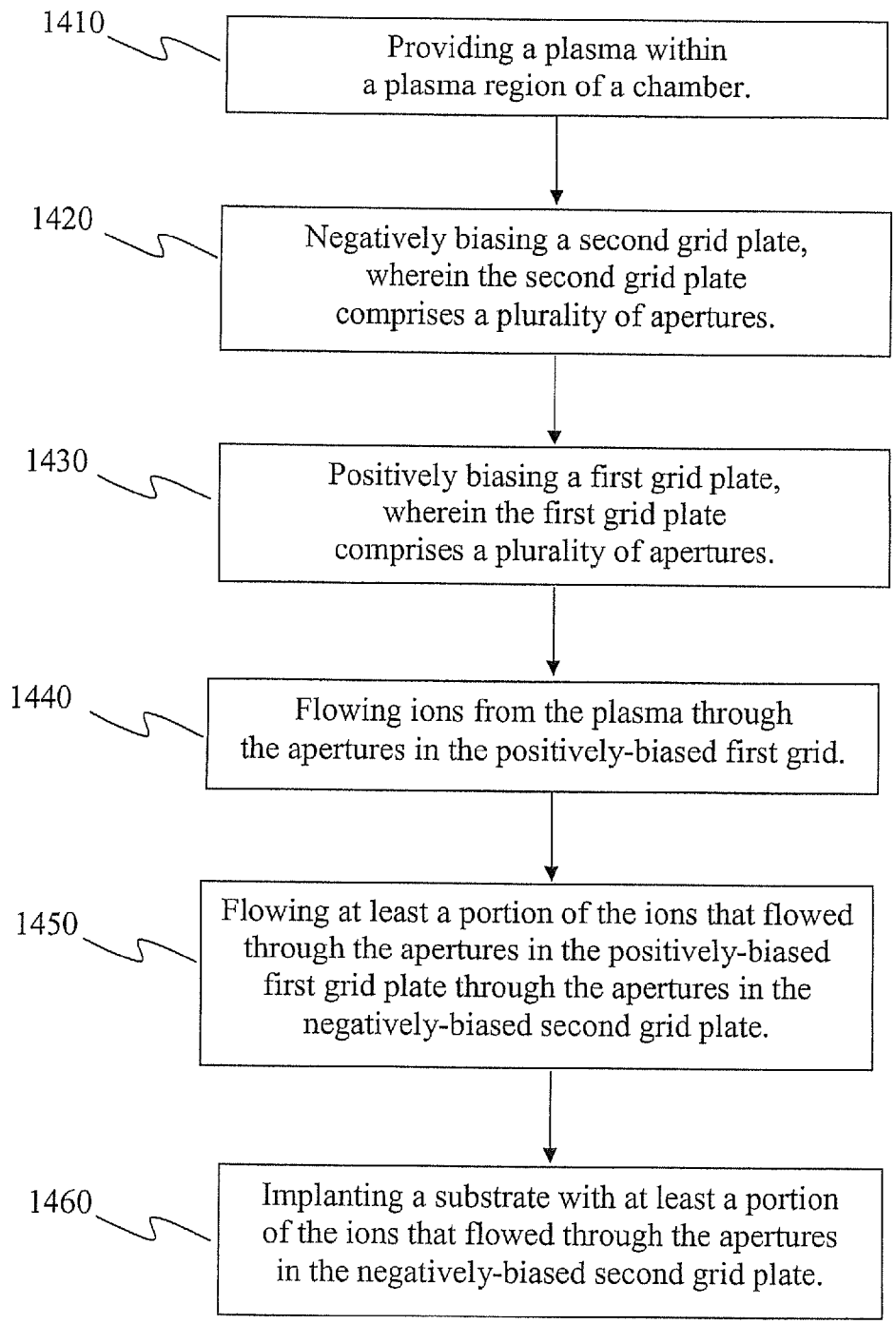
FIG. 14 illustrates a process flow diagram of one embodiment of a method of ion implantation in accordance with the principles of the present invention.

FIG. 14 illustrates a process flow diagram of one embodiment of a method 1400 of ion implantation in accordance with the principles of the present invention. At step 1410, a plasma is provided within a plasma region of a chamber. A first grid plate and a second grid plate are disposed within the chamber. At step 1420, the second grid plate is negatively biased. The second grid plate comprises a plurality of apertures and is disposed in a first position. At step 1430, the first grid plate is positively biased. The first grid plate comprises a plurality of apertures and is disposed in a first position. Although FIG. 14 shows the step of the second grid plate being negatively biased before the step of the first grid plate being positively biased, in some embodiments, the biasing of the first grid plate is initiated before or simultaneously with the biasing of the second grid plate. At step 1440, ions from the plasma in the plasma region are flown through the apertures in the positively-biased first grid plate. At step 1450, at least a portion of the ions that flowed through the apertures in the positively-biased first grid plate are flown through the apertures in the negatively-biased second grid plate. At step 1460, a substrate is implanted with at least a portion of the ions that flowed through the apertures in the negatively-biased second grid plate, with the substrate being disposed in a first position. The process can then be repeated with the positioning of the grid plates and/or the substrate being adjusted in order to achieve both homogeneous and selective ion implantation.

Figure 15:
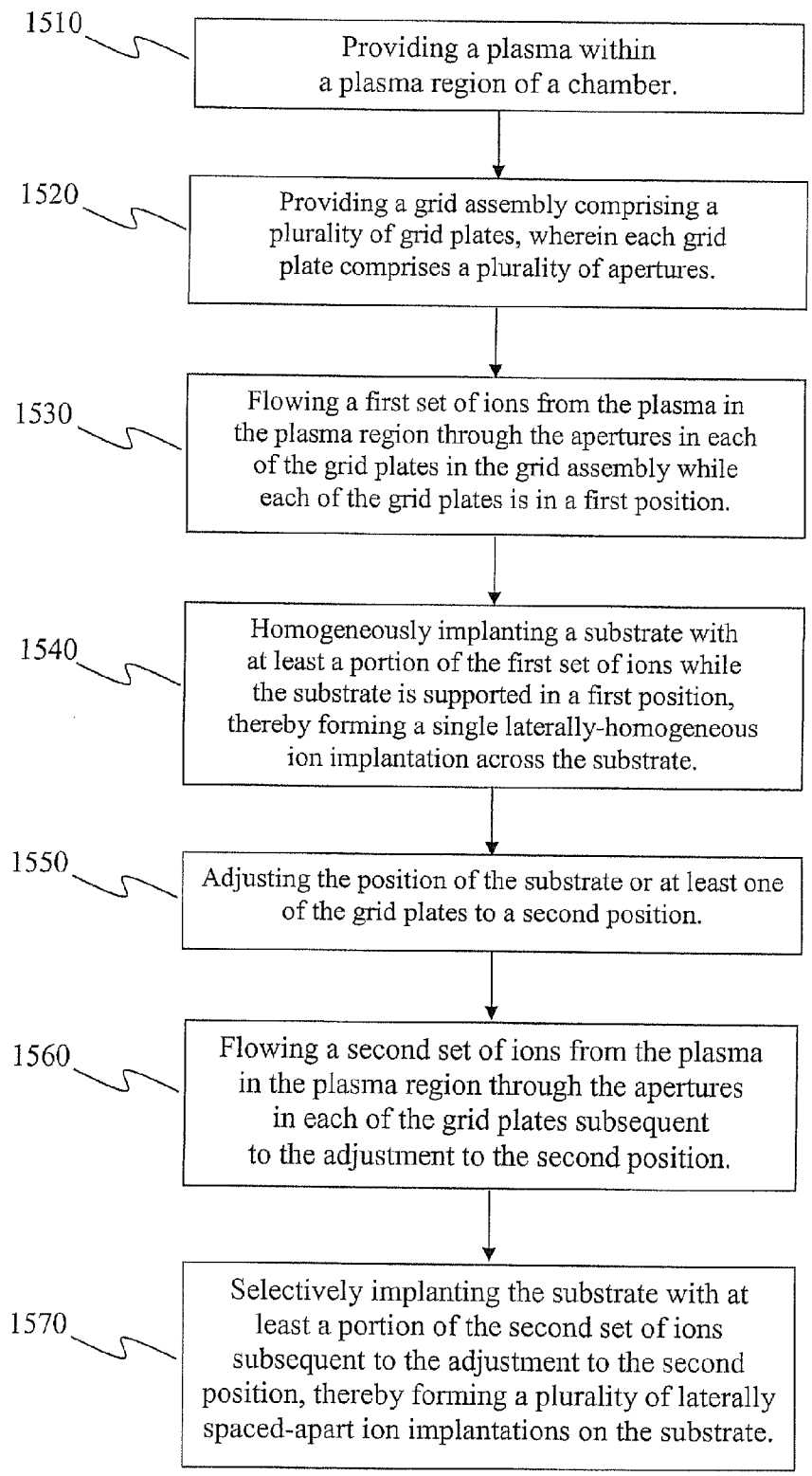
FIG. 15 illustrates a process flow diagram of another embodiment of a method of ion implantation in accordance with the principles of the present invention.

FIG. 15 illustrates a process flow diagram of another embodiment of a method 1500 of ion implantation in accordance with the principles of the present invention. At step 1510, a plasma is provided within a plasma region of a chamber. At step 1520, a grid assembly is provided comprising a plurality of grid plates. Each grid plate comprises a plurality of apertures. At step 1530, a first set of ions from the plasma in the plasma region is flown through the apertures in each of the grid plates in the grid assembly while each of the grid plates is in a first position. At step 1540, a substrate is homogeneously implanted with at least a portion of the first set of ions that flowed through the apertures in the grid plates while the substrate is supported in a first position by a substrate holder, thereby forming a single laterally-homogeneous ion implantation across the substrate from a combination of the first set of ions that have passed through different apertures of the same grid plate. At step 1550, the position of the substrate or at least one of the grid plates is adjusted to a second position. At step 1560, a second set of ions from the plasma in the plasma region is flown through the apertures in each of the grid plates in the grid assembly subsequent to the adjustment to the second position. At step 1570, the substrate is selectively implanted with at least a portion of the second set of ions that flowed through the apertures in the grid plates subsequent to the adjustment to the second position, thereby forming a plurality of laterally spaced-apart ion implantations on the substrate from a portion of the second set of ions that have passed through different apertures of the same grid plate.

Figure 16:
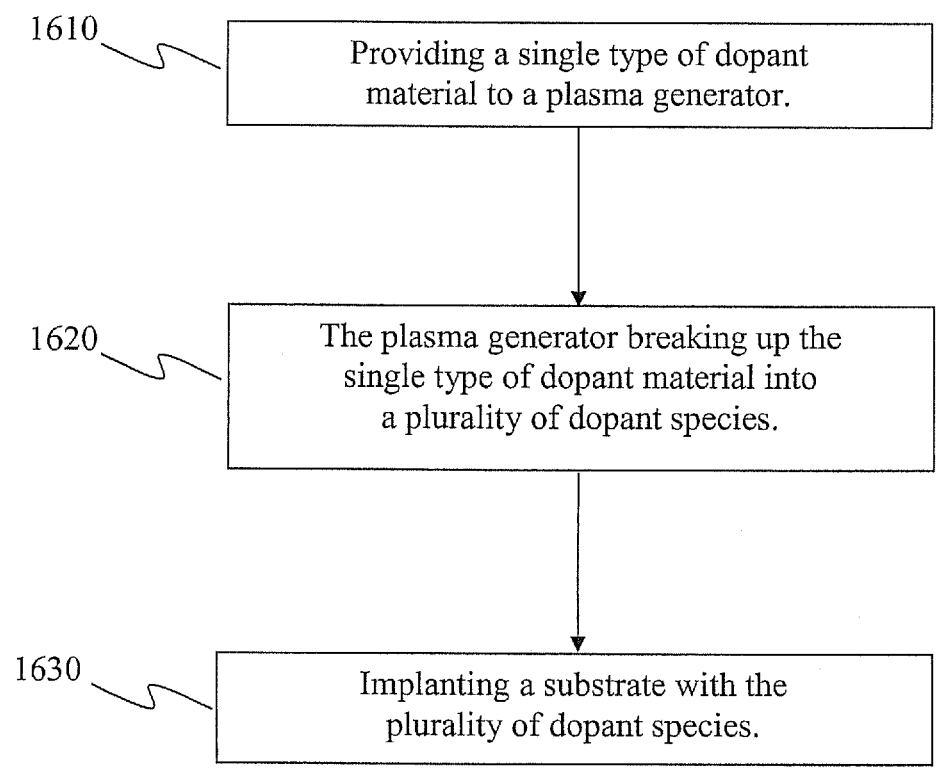
FIG. 16 illustrates a process flow diagram of yet another embodiment of a method of ion implantation in accordance with the principles of the present invention.

FIG. 16 illustrates a process flow diagram of yet another embodiment of a method 1600 of ion implantation in accordance with the principles of the present invention. At step 1610, a single type of dopant material is provided to a plasma generator. At step 1620, the plasma generator breaks up the single type of dopant material into a plurality of dopant species. At step 1630, a substrate is implanted with the plurality of dopant species.

In some embodiments, a combination of different types of dopant material is used to implant different pluralities of dopant species. In some embodiments, the different types of dopant material can be provided in precursor form as gasses, liquids, solids, or any combination thereof.

The present invention has been described in terms of specific embodiments incorporating details to facilitate the understanding of principles of construction and operation of the invention. Such reference herein to specific embodiments and details thereof is not intended to limit the scope of the claims appended hereto. It will be readily apparent to one skilled in the art that other various modifications may be made in the embodiment chosen for illustration without departing from the spirit and scope of the invention as defined by the claims.

What is claimed is:

1. A plasma grid implantation system for fabricating solar cells from a substrate, comprising: a plasma source configured to provide plasma in a plasma region; a first grid plate comprising a plurality of apertures configured to allow ions from the plasma region to pass through the first grid plate, wherein the first grid plate is positively biased by a power supply; a second grid plate comprising a plurality of apertures configured to allow the ions to pass through the second grid plate subsequent to the ions passing through the first grid plate, wherein the second grid plate is negatively biased by a power supply; a third grid plate disposed between the second grid plate and the substrate holder, the third grid plate comprising a plurality of apertures configured to allow the ions to pass through the third grid plate subsequent to the ions passing through the second grid plate, wherein the third grid plate is coupled to ground potential; a substrate holder configured to support the substrate in a position where the substrate is implanted with the ions subsequent to the ions passing through the third grid plate to thereby dope the substrate and fabricate a solar cell; a chamber defined by chamber walls, wherein the plasma region, the first grid plate, the second grid plate, and the third grid plate are housed within the chamber; and, a conveyor belt transporting the substrates from an atmospheric side to vacuum side inside the chamber; wherein: the position of at least one of the first grid plate, the second grid plate, and the substrate holder is configured to be adjusted between a homogeneous implantation position and a selective implantation position; the homogeneous implantation position is configured for a single laterally-homogeneous ion implantation across the substrate on the substrate holder, wherein the single laterally-homogeneous ion implantation is formed from a combination of beamlets that have passed through different apertures of the third grid plate and combined by space charge expansion into a uniform beam; the selective implantation position is configured for a plurality of laterally spaced-apart ion implantations of the substrate on the substrate holder, wherein the plurality of laterally spaced-apart ion implantations is formed from individual ion beamlets that have passed through the different apertures of the third grid plate; and, wherein the first grid plate, the second grid plate and the third grid plate form a grid plate assembly, wherein the grid plate assembly is configured to focus the beamlets into known shapes onto the substrate to thereby form the selective implantation.

2. The system of claim 1, wherein:
the conveyor is configured to transport multiple substrate for simultaneous homogeneous implantation, followed by simultaneous selective implantation.

3. The system of claim 1, wherein the apertures of at least one of the first grid plate and the second grid plate are substantially circular holes.

4. The system of claim 1, wherein the apertures of at least one of the first grid plate and the second grid plate are elongated slots.

5. The system of claim 3, wherein each one of the circular hole apertures of at least one of the first grid plate and the second grid plate comprises a top end and a bottom end, wherein the bottom end is closer to the substrate holder than the top end, and wherein the diameter of each aperture gradually increases from the top end to the bottom end.

6. The system of claim 1, wherein the first grid plate and the second grid plate comprise a material chosen from the group consisting of: silicon, graphite, silicon carbide, and tungsten.

7. The system of claim 1, wherein the chamber walls are configured to repel ions in the plasma region using a magnetic field to push the plasma off the chamber walls.

8. The system of claim 7, wherein one or more magnets are coupled to the chamber walls.

9. The system of claim 1, wherein the first grid plate is configured to be DC positively-biased, either in continuous mode or in pulsed mode.

10. The system of claim 1, further comprising a first pulse forming network coupled to the second grid plate such that the second grid plate is configured to be DC negatively-biased, in pulsed mode.

11. The system of claim 1, wherein the first grid plate, the second grid plate, and the substrate holder are all configured to have their positions adjustable.

12. The system of claim 1, wherein the third grid plate is removable.

13. The system of claim 1, wherein the first grid plate and the second grid plates are configured to accelerate ions from the plasma and minimize back streaming electrons.

14. The system of claim 10, further comprising a second pulse-forming network coupled to the plasma source and in modulation with the first pulse-forming network.

15. The system of claim 1, further comprising a high-voltage pulser coupled to the substrate holder to negatively bias the substrate.

16. The system of claim 1, further comprising a shadow mask positioned close to the third grid plate.

17. The system of claim 1, further comprising a hard mask placed in contact with the substrate.

18. The system of claim 1, wherein the chamber walls are configured to enclose multiple substrates for simultaneous implantation.

* * * * *